(12) United States Patent
Suk et al.

(10) Patent No.: US 12,494,412 B2
(45) Date of Patent: Dec. 9, 2025

(54) SEMICONDUCTOR PACKAGE

(71) Applicant: Samsung Electronics Co., Ltd., Suwon-si (KR)

(72) Inventors: Kyoung Lim Suk, Suwon-si (KR); Bangweon Lee, Yongin-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 614 days.

(21) Appl. No.: 17/852,542

(22) Filed: Jun. 29, 2022

(65) Prior Publication Data

US 2023/0058497 A1 Feb. 23, 2023

(30) Foreign Application Priority Data

Aug. 18, 2021 (KR) .................. 10-2021-0108784

(51) Int. Cl.
H01L 23/48 (2006.01)
H01L 21/48 (2006.01)
(Continued)

(52) U.S. Cl.
CPC ........ *H01L 23/481* (2013.01); *H01L 23/3128* (2013.01); *H01L 23/49816* (2013.01); (Continued)

(58) Field of Classification Search
CPC ............... H01L 25/0657; H01L 25/043; H01L 25/0652; H01L 25/071; H01L 25/074; H01L 25/0756; H01L 25/117; H01L 2225/06527; H01L 2225/06548; H01L 24/19–20; H01L 2224/19–225; (Continued)

(56) References Cited

U.S. PATENT DOCUMENTS 9,653,443 B2  5/2017 Cheng et al.
10,269,767 B2  4/2019 Chen et al.
(Continued)

FOREIGN PATENT DOCUMENTS

KR  1020200134377 A  12/2020
KR  1020210075353 A  6/2021
(Continued)

*Primary Examiner* — Julio J Maldonado
*Assistant Examiner* — Paul A Berry
(74) *Attorney, Agent, or Firm* — Muir Patent Law, PLLC

(57) ABSTRACT

A semiconductor package includes a package substrate, a first semiconductor chip mounted on the package substrate, a first molding layer on the package substrate and surrounding the first semiconductor chip, a redistribution layer on the first molding layer, a first through via that vertically penetrates the first molding layer and connects the package substrate to the redistribution layer, a second semiconductor chip mounted on the redistribution layer, a second molding layer on the redistribution layer and surrounding the second semiconductor chip, and a second through via that vertically penetrates the second molding layer and is connected to the redistribution layer. A first width of the first through via is less than a second width of the second through via. The second through via is electrically floated from a signal circuit of the second semiconductor chip.

19 Claims, 25 Drawing Sheets

(51) Int. Cl.
*H01L 23/00* (2006.01)
*H01L 23/31* (2006.01)
*H01L 23/498* (2006.01)
*H01L 25/10* (2006.01)

(52) U.S. Cl.
CPC .. *H01L 23/49822* (2013.01); *H01L 23/49838* (2013.01); *H01L 24/16* (2013.01); *H01L 25/105* (2013.01); *H01L 21/4857* (2013.01); *H01L 21/486* (2013.01); *H01L 2224/16227* (2013.01); *H01L 2224/16238* (2013.01); *H01L 2225/1023* (2013.01); *H01L 2225/1041* (2013.01); *H01L 2225/107* (2013.01); *H01L 2225/1094* (2013.01); *H01L 2924/1811* (2013.01); *H01L 2924/182* (2013.01); *H01L 2924/183* (2013.01); *H01L 2924/3511* (2013.01)

(58) Field of Classification Search
CPC ... H01L 24/96; H01L 2224/96; H01L 25/105; H01L 2924/1811; H01L 2924/182; H01L 2224/08145; H01L 23/481; H01L 21/486; H01L 2225/06589; H01L 23/5389; H01L 23/5386; H01L 25/10–13; H01L 2225/10–1094; H01L 2224/02372; H01L 2224/29009; H01L 2224/29025; H01L 2225/06503–0651; H01L 2225/06541–06555; H01L 23/4334
See application file for complete search history.

(56) References Cited

U.S. PATENT DOCUMENTS

| | | | |
|---|---|---|---|
| 10,312,205 B2 | 6/2019 | Han | |
| 10,672,741 B2 | 6/2020 | Yu et al. | |
| 11,824,040 B2 * | 11/2023 | Wu | H01L 23/16 |
| 2015/0371947 A1 * | 12/2015 | Chen | H01L 24/25 |
| | | | 257/774 |
| 2016/0276308 A1 | 9/2016 | Min et al. | |
| 2018/0122780 A1 * | 5/2018 | Chen | H01L 23/49811 |
| 2018/0350745 A1 * | 12/2018 | Hsieh | H01L 24/83 |
| 2020/0312774 A1 * | 10/2020 | Yu | H01L 21/6835 |
| 2020/0373216 A1 | 11/2020 | Yoo et al. | |
| 2021/0043573 A1 * | 2/2021 | Eid | H01L 25/18 |
| 2021/0090993 A1 | 3/2021 | Yu et al. | |

FOREIGN PATENT DOCUMENTS

| | | |
|---|---|---|
| TW | 201813017 A | 4/2018 |
| TW | 202038354 A | 10/2020 |
| TW | 202129885 A | 8/2021 |

* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0108784 filed on Aug. 18, 2021 in the Korean Intellectual Property Office, the disclosure of which is hereby incorporated by reference in its entirety.

TECHNICAL FIELD

The present inventive concepts relate to a semiconductor package and a method of fabricating the same, and more particularly, to a semiconductor package including a plurality of semiconductor chips in one package and a method of fabricating the same.

DISCUSSION OF RELATED ART

A semiconductor package is provided to implement an integrated circuit chip to qualify for use in electronic products. In a semiconductor package, a semiconductor chip is mounted on a printed circuit board (PCB) and bonding wires or bumps are used to electrically connect the semiconductor chip to the printed circuit board.

In the semiconductor industry, electronic products having semiconductor devices operate in high performance and rapid operating speeds at compact sizes. In order to cope with this trend, there have been developed numerous stacking methods such as a plurality of semiconductor chips being stacked on a single substrate and a package being stacked on another package. A package-on-package (PoP) technique has been developed in which various semiconductor chips are vertically stacked to implement high-density chip stacking. With the package-on-package technique, semiconductor chips having various functions may be integrated on a smaller area than a conventional package made of one semiconductor chip. However, as a plurality of semiconductor chips are integrated onto one package, there may occur problems associated with wire layouts or thermal budget.

SUMMARY

Some embodiments of the present inventive concepts provide a semiconductor package with improved thermal stability and increased operational reliability.

Some embodiments of the present inventive concepts provide a semiconductor package with improved electrical properties.

According to some embodiments of the present inventive concepts, a semiconductor package may comprise: a package substrate; a first semiconductor chip mounted on the package substrate; a first molding layer on the package substrate and surrounding the first semiconductor chip; a redistribution layer on the first molding layer; a first through via that vertically penetrates the first molding layer and connects the package substrate to the redistribution layer; a second semiconductor chip mounted on the redistribution layer; a second molding layer on the redistribution layer and surrounding the second semiconductor chip; and a second through via that vertically penetrates the second molding layer and is connected to the redistribution layer. A first width of the first through via may be less than a second width of the second through via. The second through via may be electrically floated from a signal circuit of the second semiconductor chip.

According to some embodiments of the present inventive concepts, a semiconductor package may comprise: a first substrate; a first semiconductor chip mounted on a first region of the first substrate; a second substrate on the first semiconductor chip; a first through via disposed on a second region, adjacent to the first region, of the first substrate and directly connecting the first substrate to the second substrate; a second semiconductor chip mounted on a third region of the second substrate; a heat radiator on the second semiconductor chip; a second through via on a fourth region, adjacent to the third region, of the second substrate and directly connecting the second substrate to the heat radiator; and a plurality of external terminals on a bottom surface of the first substrate. The second through via may be electrically insulated from the second semiconductor chip.

According to some embodiments of the present inventive concepts, a semiconductor package may comprise: a package substrate; a first semiconductor chip disposed on a first region of the package substrate and mounted on a first substrate pad of the package substrate through a first chip terminal; a first molding layer on the package substrate and surrounding the first semiconductor chip; a first through via disposed on a second region, adjacent to the first region, of the package substrate and vertically penetrating the first molding layer, the first through via being connected to a second substrate pad of the package substrate; a redistribution layer on the first molding layer and connected to the first through via which is exposed at an upper surface of the first molding layer; a second semiconductor chip disposed on a third region of the redistribution layer and mounted on a signal pad of the redistribution layer through a second chip terminal; a second molding layer on the redistribution layer and surrounding the second semiconductor chip; a second through via disposed on a fourth region, adjacent to the third region, of the redistribution layer and vertically penetrating the second molding layer, the second through via being connected to a dummy pad of the redistribution layer; and a plurality of external terminals on a bottom surface of the package substrate. The second through via may be electrically insulated from the second semiconductor chip and the first through via.

DETAILED DESCRIPTION OF EMBODIMENTS

The following will now describe a semiconductor package according to the present inventive concepts with reference to the accompanying drawings.

Figure 1:
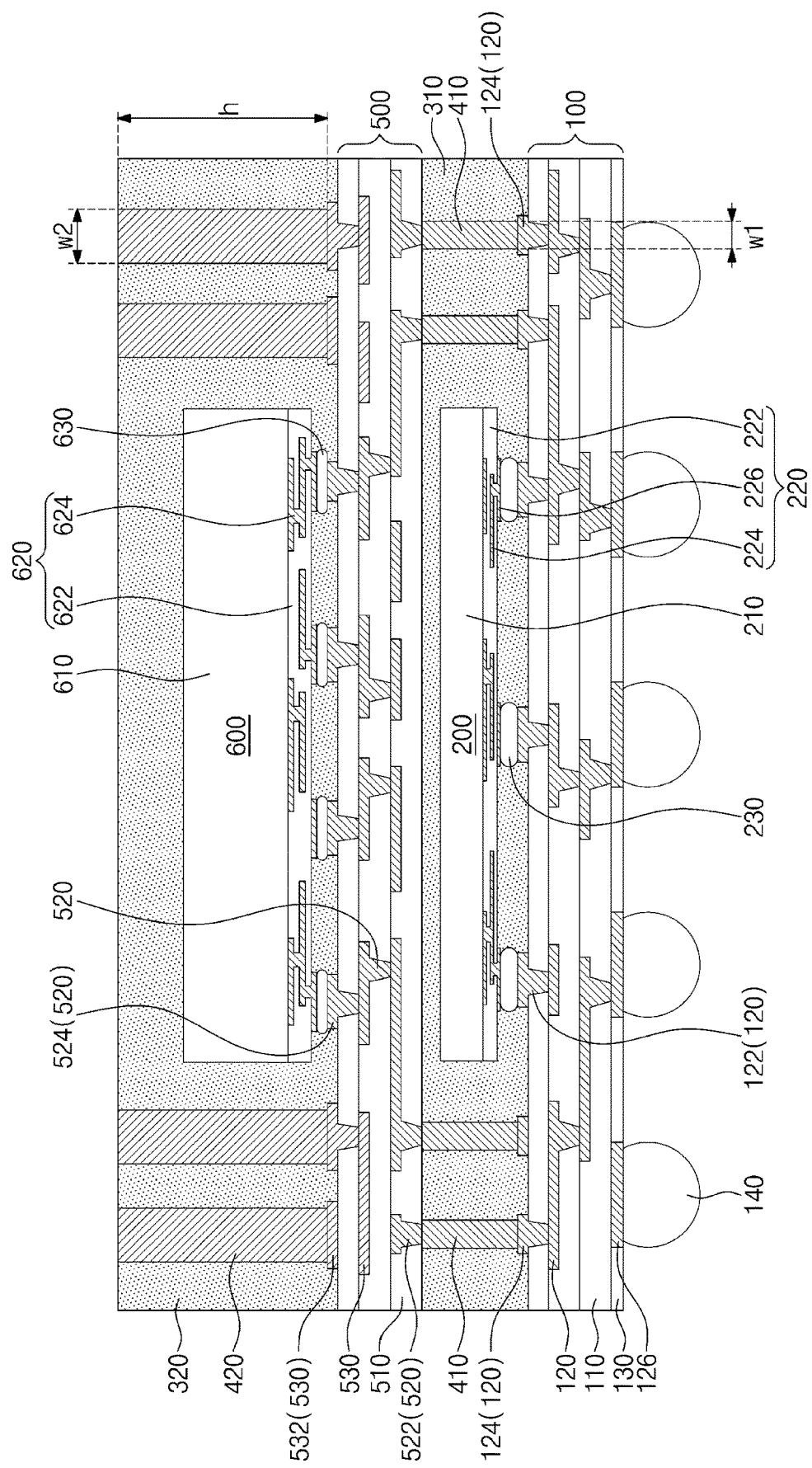
FIG. 1 illustrates a cross-sectional view showing a semiconductor package according to some embodiments of the present inventive concepts.

FIG. 1 illustrates a cross-sectional view showing a semiconductor package according to some embodiments of the present inventive concepts.

Referring to FIG. 1, a first substrate 100 may be provided. The first substrate 100 may be a package substrate. The first substrate 100 may include one or more first substrate wiring layers that are stacked on each other. Each of the first substrate wiring layers may include a first substrate dielectric pattern 110 and a first substrate wiring pattern 120 in the first substrate dielectric pattern 110. The first substrate wiring pattern 120 in one first substrate wiring layer may be electrically connected to the first substrate wiring pattern 120 in another first substrate wiring layer adjacent to the one first substrate wiring layer.

The first substrate dielectric pattern 110 may include or may be formed of a dielectric polymer or a photo-imageable dielectric (PID). For example, the photo-imageable dielectric may include or may be formed of at least one selected from photosensitive polyimide, polybenzoxazole (PBO), phenolic polymers, and benzocyclobutene polymers.

The first substrate wiring pattern 120 may be provided in the first substrate dielectric pattern 110. The first substrate wiring pattern 120 may have a damascene structure. For example, the first substrate wiring pattern 120 may have a head part and a tail part that are connected into a single unitary piece. The head part may be a pad or wiring portion that extends horizontally in the first substrate 100. The tail part may be a via portion that is vertically connected to a certain component in the first substrate 100. The first substrate wiring pattern 120 may have a cross-section shaped like T. The first substrate wiring pattern 120, or the head part thereof, may have a top surface that is exposed at a top surface of the first substrate dielectric pattern 110. The first substrate wiring pattern 120, or the tail part thereof, may have a bottom surface that is exposed at a bottom surface of the first substrate dielectric pattern 110. The tail part of the first substrate wiring pattern 120 in one first substrate wiring layer may be coupled to the head part of the first substrate wiring pattern 120 in another first substrate wiring layer that underlies the one first substrate wiring layer. The first substrate wiring pattern 120 may include or may be formed of a conductive material. For example, the first substrate wiring pattern 120 may include or may be formed of copper (Cu). In some embodiments, the first substrate wiring pattern 120 may be formed of a multi-level interconnect structure.

The head part of the first substrate wiring pattern 120 in an uppermost one of the first substrate wiring layers may correspond to substrate pads 122 and 124 of the first substrate 100. For example, as shown in FIG. 1, concerning the uppermost first substrate wiring layer, the head part of the first substrate wiring pattern 120 may be positioned on a top surface of the first substrate dielectric pattern 110. For example, the substrate pads 122 and 124 may protrude from the top surface of the first substrate dielectric pattern 110. The substrate pads 122 and 124 may include a first substrate pad 122 on which a first semiconductor chip 200 is mounted, and a second substrate pad 124 to which a first through via 410 is coupled. The first semiconductor chip 200 and the first through via 410 will be discussed.

A third substrate pad 126 may be provided below a lowermost one of the first substrate wiring layers. The third substrate pad 126 may be coupled to the first substrate wiring pattern 120. The third substrate pad 126 may include or may be formed of a conductive material. For example, the third substrate pad 126 may include or may be formed of copper (Cu). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

A substrate passivation layer 130 may be provided below the lowermost first substrate wiring layer. The substrate passivation layer 130 may entirely cover a bottom surface of the first substrate 100. The third substrate pad 126 may be exposed at a bottom surface of the substrate passivation layer 130.

An external terminal 140 may be provided on the exposed third substrate pad 126. The external terminal 140 may include or may be a solder ball or a solder bump.

Although not shown, a barrier layer may be interposed between the first substrate dielectric pattern 110 and the first substrate wiring pattern 120. The barrier layer may conformally cover lateral and bottom surfaces of the first substrate wiring pattern 120. A range of about 50 Å to about 1,000 Å may be given as a thickness of the barrier layer, or a thickness of a gap between the first substrate wiring pattern 120 and the first substrate dielectric pattern 110. The barrier layer may include or may be formed of metal such as titanium (Ti) and tantalum (Ta) or metal nitride such as titanium nitride (TiN) and tantalum nitride (TaN). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A first semiconductor chip 200 may be disposed on the first substrate 100. The first semiconductor chip 200 may be located on a top surface of the first substrate 100. The first semiconductor chip 200 may be, for example, a memory chip. In some embodiments, the first semiconductor chip 200 may be a logic chip. The first semiconductor chip 200 may be disposed in a face-down state on the first substrate 100. For example, the first semiconductor chip 200 may have a front surface directed toward the first substrate 100 and a rear surface opposite to the front surface. In this description, the language "front surface" may indicate an active surface of an integrated element in a semiconductor chip or a surface on which a plurality of pads of a semiconductor chip are formed, and the language "rear surface" may indicate an opposite surface that faces the front surface. The first semiconductor chip 200 may include a first base layer 210 and a first circuit layer 220 provided on one surface of the first base layer 210 directed toward the first substrate 100. According to some embodiments, the first semiconductor chip 200 may include a first passivation layer opposite to the first circuit layer 220, and may also include at least one chip via that penetrates the first base layer 210 and is connected to the first circuit layer 220.

The first base layer 210 may include or may be formed of silicon (Si). An integrated element or integrated circuits may be formed in a lower portion of the first base layer 210.

The first circuit layer 220 may be provided on a bottom surface of the first base layer 210. The first circuit layer 220 may be electrically connected to the integrated element or the integrated circuits formed in the first base layer 210. For example, the first circuit layer 220 may have a first circuit pattern 224 provided in the first dielectric pattern 222, and the first circuit pattern 224 may be coupled to the integrated element or the integrated circuits formed in the first base layer 210. A portion of the first circuit pattern 224 may be exposed at a top surface of the first circuit layer 220, and the exposed portion of the first circuit pattern 224 may correspond to a first chip pad of the first semiconductor chip 200. The exposed first chip pad is indicated using the same reference numeral as that assigned to the first circuit pattern 224. The bottom surface of the first semiconductor chip 200 may be an active surface at which the first circuit layer 220 is provided.

The first semiconductor chip 200 may be mounted on the first substrate 100. The first semiconductor chip 200 may be flip-chip mounted on the first substrate 100. For example, the first circuit layer 220 of the first semiconductor chip 200 may be directed toward (i.e., may face) the first substrate 100. A first chip terminal 230 may be provided below a first chip pad 226 of the first semiconductor chip 200. The first semiconductor chip 200 may be mounted on the first substrate 100 using the first chip terminal 230. The first chip terminal 230 may connect the first chip pad 226 of the first semiconductor chip 200 to the first substrate pad 122 of the first substrate 100.

A first molding layer 310 may be provided on the first substrate 100. The first molding layer 310 may cover the top surface of the first substrate 100. When viewed in a plan view, the first molding layer 310 may surround the first semiconductor chip 200. The first molding layer 310 may cover lateral surfaces of the first semiconductor chip 200 and may also cover the rear surface of the first semiconductor chip 200. According to some embodiments, the first molding layer 310 may expose the rear surface of the first semiconductor chip 200, and the first molding layer 310 may have a top surface coplanar with the rear surface of the first semiconductor chip 200. The first molding layer 310 may fill a gap between the first substrate 100 and the first semiconductor chip 200. The first molding layer 310 may surround the first chip terminal 230 between the first substrate 100 and the first semiconductor chip 200. The first molding layer 310 may include or may be formed of a dielectric material, such as an epoxy molding compound (EMC).

A first through via 410 may be provided on the first substrate 100. The first through via 410 may be adjacent to the first semiconductor chip 200. The first through via 410 may vertically penetrate the first molding layer 310. The first through via 410 may extend toward the first substrate 100 so that a lower end of the first through via 410 is coupled to the second substrate pad 124 of the first substrate 100. The first through via 410 may have another end (i.e., an upper end) that is exposed at the top surface of the first molding layer 310. The first through via 410 may have a top surface coplanar with that of the first molding layer 310. The first through via 410 may have a circular or polygonal pillar shape that vertically penetrates the first molding layer 310. The first through via 410 may have a first width w1 that is uniform regardless of distance from the first substrate 100.

In some embodiments, the first through via 410 may have a decreasing width toward the first substrate 100. The first through via 410 may constitute a signal line for connection between the first substrate 100 and a second semiconductor chip 600 which will be discussed below, and may be a signal delivery via for electrical connection between the first substrate 100 and a second substrate 500 on which the second semiconductor chip 600 is mounted. The first through via 410 may include or may be formed of metal. For example, the first though via 410 may include or may be formed of copper (Cu).

In this description, the term "through via" may indicate a via that vertically penetrates a certain component, and no limitation is imposed on a planar shape of the "through via." For example, the shape of the "through via" may include a circular pillar shape, a polygonal pillar shape, a partition shape, a bar shape, or a wall shape.

A second substrate 500 may be provided on the first molding layer 310. The second substrate 500 may be a redistribution layer including one or more second substrate wiring layers that are stacked on each other. Each of the second substrate wiring layers may include a second substrate dielectric pattern 510 and second substrate wiring patterns 520 and 530 in the second substrate dielectric pattern 510. The second substrate wiring patterns 520 and 530 in one second substrate wiring layer may be electrically connected to the second substrate wiring patterns 520 and 530 in another second substrate wiring layer adjacent to the one second substrate wiring layer. The second substrate 500 may have a bottom surface in contact with the top surface of the first molding layer 310 and with the top surface of the first through via 410.

The second substrate dielectric pattern 510 may include or may be formed of a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

The second substrate wiring patterns 520 and 530 may be provided in the second substrate dielectric pattern 510. Each of the second substrate wiring patterns 520 and 530 may have a damascene structure. For example, each of the second substrate wiring patterns 520 and 530 may have a head part and a tail part that are integrated into a single unitary piece. The head part may be a pad or wiring portion that extends horizontally in the second substrate 500. The tail part may be a via portion that is vertically connected to a certain component in the second substrate 500. Each of the second substrate wiring patterns 520 and 530 may have a T-shaped cross section. A top surface of the second substrate wiring patterns 520 and 530, or a top surface of the head part of the second substrate wiring patterns 520 and 530, may be exposed at a top surface of the second substrate dielectric pattern 510. A bottom surface of the second substrate wiring patterns 520 and 530, or a bottom surface of the head part of the second substrate wiring patterns 520 and 530, may be exposed at a bottom surface of the second substrate dielectric pattern 510. The tail part of the second substrate wiring patterns 520 and 530 in one second substrate wiring layer may be coupled to the head part of the second substrate wiring patterns 520 and 530 in another second substrate wiring layer that is disposed below the one second substrate wiring layer. The second substrate wiring patterns 520 and 530 may include or may be formed of a conductive material. For example, the second substrate wiring patterns 520 and 530 may include or may be formed of copper (Cu).

The second substrate wiring patterns 520 and 530 may include a redistribution pattern 520 and a dummy wiring pattern 530. The redistribution pattern 520 may be a wiring pattern for redistributing the second semiconductor chip 600 mounted on the second substrate 500. The dummy wiring pattern 530 may be a wiring pattern that is electrically floated from the redistribution pattern 520. For example, the dummy wiring pattern 530 may be electrically insulated from the second semiconductor chip 600, the redistribution pattern 520, and the first through via 410. In this description, the term "floated" may mean "configured as a separate independent circuit electrically isolated from a target circuit" or "completely electrically insulated from." As used herein, the term "dummy" is used to refer to a component that has the same or similar structure and shape as other components but does not have a substantial function and exists only as a pattern in the device.

The second substrate 500 may be electrically connected to the first through via 410. For example, concerning a lowermost one of the second substrate wiring layers, the redistribution pattern 522 may be coupled to the first through via 410. For example, the tail part of the redistribution pattern 522 in the lowermost second substrate wiring layer may penetrate the second substrate dielectric pattern 510 of the lowermost second substrate wiring layer and may contact the first through via 410. The second substrate 500 may be electrically connected through the first through via 410 to the first substrate 100 and the first semiconductor chip 200.

A fourth substrate pad 524 may refer to the head part of the redistribution pattern in an uppermost one of the second substrate wiring layers. For example, as shown in FIG. 1, concerning the uppermost second substrate wiring layer, the head part of the redistribution pattern 520 may be positioned on the top surface of the second substrate dielectric pattern 510. The fourth substrate pad 524 may protrude from the top surface of the second substrate dielectric pattern 510. The fourth substrate pad 524 may be a signal pad for mounting the second semiconductor chip 600.

A fifth substrate pad 532 may refer to the head part of the dummy wiring pattern 530 in the uppermost one of the second substrate wiring layers. For example, as shown in FIG. 1, concerning the second substrate wiring layer, the head part of the dummy wiring pattern 530 may be positioned on the top surface of the second substrate dielectric pattern 510. The fifth substrate pad 532 may protrude from the top surface of the second substrate dielectric pattern 510. The fifth substrate pad 532 may be a dummy pad that is electrically insulated from the second semiconductor chip 600, the redistribution pattern 520 of the second substrate 500, and the first through via 410.

Although not shown, a barrier layer may be interposed between the second substrate dielectric pattern 510 and the second substrate wiring patterns 520 and 530. The barrier layer may conformally cover lateral and bottom surfaces of the second substrate wiring patterns 520 and 530. A range of about 50 Å to about 1,000 Å may be given as a thickness of the barrier layer, or a thickness of a gap between the second substrate dielectric pattern 510 and the second substrate wiring patterns 520 and 530. The barrier layer may include or may be formed of metal such as titanium (Ti) and tantalum (Ta) or metal nitride such as titanium nitride (TiN) and tantalum nitride (TaN).

A second semiconductor chip 600 may be disposed on the second substrate 500. The second semiconductor chip 600 may be located on a top surface of the second substrate 500. The second semiconductor chip 600 may be, for example, a logic chip. The second semiconductor chip 600 may include or may be a processor, such as a central processing unit (CPU), a graphic processing unit (GPU), and a neutral processing unit (NPU). The second semiconductor chip 600 may be disposed in a face-down state on the second substrate 500. For example, the second semiconductor chip 600 may have a front surface directed toward (i.e., facing) the second substrate 500 and a rear surface opposite to the front surface. The second semiconductor chip 600 may vertically overlap the first semiconductor chip 200. For example, when viewed in a plan view, the second semiconductor chip 600 may cover the first semiconductor chip 200. The second semiconductor chip 600 may have a thickness greater than a thickness of the first semiconductor chip 200. The second semiconductor chip 600 may include a second base layer 610 and a second circuit layer 620 provided on one surface of the second base layer 610.

The second base layer 610 may include or may be formed of silicon (Si). An integrated element or integrated circuits may be formed in a lower portion of the second base layer 610.

The second circuit layer 620 may be provided on a bottom surface of the second base layer 610. The second circuit layer 620 may be electrically connected to the integrated element or the integrated circuits formed in the second base layer 610. For example, the second circuit layer 620 may have a second circuit pattern 624 provided in the second dielectric pattern 622, and the second circuit pattern 624 may be coupled to the integrated element or the integrated circuits formed in the second base layer 610. A portion of the second circuit pattern 624 may be exposed at a bottom surface of the second circuit layer 620, and the exposed portion of the second circuit pattern 624 may correspond to a second chip pad of the second semiconductor chip 600. The exposed second chip pad is indicated using the same reference numeral as that assigned to the second circuit pattern 624. The bottom surface of the second semiconductor chip 600 may be an active surface at which the second circuit layer 620 is provided.

The second semiconductor chip 600 may be mounted on the second substrate 500. The second semiconductor chip 600 may be flip-chip mounted on the second substrate 500. For example, the second circuit layer 620 of the second semiconductor chip 600 may be directed toward (i.e., may face) the second substrate 500. A second chip terminal 630 may be provided below the exposed second chip pad of the second circuit pattern 624 in the second semiconductor chip 600. The second semiconductor chip 600 may be mounted on the second substrate 500 using the second chip terminal 630. The second chip terminal 630 may connect the second chip pad 624 of the second semiconductor chip 600 to the fourth substrate pad 524 of the second substrate 500. The second semiconductor chip 600 may be connected to the first substrate 100 and the first semiconductor chip 200 through the second chip terminal 630, the second substrate 500, and the first through via 410.

According to some embodiments of the present inventive concepts, the second substrate 500 on which the second semiconductor chip 600 is mounted may be directly connected to the first through via 410, without a separate component. For example, the second substrate 500 and the first substrate 100 may be directly connected to each other through only the first through via 410, and the second semiconductor chip 600 may be connected to the first substrate 100 through only the second substrate 500 and the first through via 410. Therefore, an electrical connection length may be reduced between the second semiconductor chip 600 and the first substrate 100, and a semiconductor package may provide a faster signal path among components. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A second molding layer 320 may be provided on the second substrate 500. The second molding layer 320 may cover the top surface of the second substrate 500. When viewed in a plan view, the second molding layer 320 may surround the second semiconductor chip 600. The second molding layer 320 may cover lateral and rear surfaces of the second semiconductor chip 600. The second molding layer 320 may include or may be formed of a dielectric material, such as an epoxy molding compound (EMC).

A second through via 420 may be provided on the second substrate 500. The second through via 420 may be adjacent to the second semiconductor chip 600. The second through via 420 may vertically penetrate the second molding layer 320. The second through via 420 may extend toward the second substrate 500 so that a lower end of the second through via 420 is coupled to the fifth substrate pad 532 of the second substrate 500. The second through via 420 may have another end (i.e., an upper end) that is exposed at a top surface of the second molding layer 320. The second through via 420 may have a top surface coplanar with that of the second molding layer 320. FIG. 1 depicts that the second through via 420 is disposed upwardly on the first through via 410, but it may not be required that the second through via 420 vertically overlap the first through via 410. For example, the second through via 420 and the first through via 410 may not vertically overlap each other, and may be shifted from each other in one direction parallel to the second substrate 500. In some embodiments, the second through via 420 and the first through via 410, when viewed in a plan view, may not overlap each other so that the second through via 420 is spaced apart from the first through via 410 in the plan view. As the second through via 420 is coupled to the redistribution pattern 520 of the second substrate 500, an arrangement of the second through via 420 may not depend on a redistribution layout of the second substrate 500 and may be variously changed as needed.

The second through via 420 may have a circular or polygonal pillar shape that vertically penetrates the second molding layer 320. The second through via 420 may have a second width w2 that is uniform regardless of distance from the second substrate 500. In some embodiments, the second through via 420 may have a decreasing width toward the second substrate 500. The second through via 420 may include or may be formed of metal. For example, the second though via 420 may include or may be formed of copper (Cu).

The second through via 420 together with the dummy wiring pattern 530 may provide a heat transfer path for outwardly discharging (i.e., dissipating) heat provided through the second substrate 500 from the second semiconductor chip 600, and the second through via 420 may be a heat transfer via for delivering the heat to outside the second molding layer 320. The through via 420 may be provided with from the fifth substrate pad 532 of the second substrate 500. The heat may be outwardly discharged (i.e., dissipated) through the top surface of the second through via 420 that is exposed at the top surface of the second molding layer 320. No electrical connection component (e.g., electrical wirings or pads) may be separately provided on the top surface of the second through via 420. In some embodiments, no electrical connection component may be connected to the top surface of the second through via 420. If being disposed on the top surface of the second through via 420, electrical connection components may block or reduce heat dissipation from the top surface of the second through via 420. To facilitate heat dissipation, a heat radiator, which will be described with reference to FIG. 6, may be disposed on the top surface of the second through via 420.

The second substrate 500 between the first and second semiconductor chips 200 and 600 may be provided with heat from the first and second semiconductor chips 200 and 600. According to some embodiments of the present inventive concepts, to discharge heat from the second substrate 500 and the first and second semiconductor chips 200 and 600, there may be provided the second through via 420 formed of metal whose thermal conductivity is greater than that of the second molding layer 320. Heat concentrated on the second substrate 500 and generated from the first and second semiconductor chips 200 and 600 may be easily outwardly discharged through the second through via 420. Therefore, a semiconductor package may decrease in temperature, improve in thermal stability and increasing in operating reliability.

To improve heart transfer through the second through via 420, a large width or surface area may be provided to the second through via 420. For example, the width w2 of the second through via 420 serving as a heat transfer via may be greater than the first width w1 of the first through via 410 serving as a signal delivery via. The second width w2 may be about 1.2 times to about 4 times the first width w1 (i.e., may have a value between about 1.2 times and about 4 times). When the second width w2 is less than about 1.2 times the first width w1, the second through via 420 may not serve as a vertical heat transfer path more than signal wirings such as the first through via 410. When the second width w2 is greater than about 4 times the first width w1, the second through via 420 may apply thermal stress to the second molding layer 320 due to difference in thermal conductivity, which may cause package warpage or may break the second molding layer 320. The second through via 420 may have an aspect ratio of about 0.3 to about 1 (i.e., may have an aspect ratio between about 0.3 and about 1). An aspect ratio of the second through via is obtained by dividing a height h of the second through via 420 by the second width w2 of the second through via 420. When the aspect ratio of the second through via 420 is greater than about 1, the second through via 420 may not serve as a vertical heat transfer path more than signal wirings such as the first through via 410. When the aspect ratio of the second through via 420 is less than about 0.4, the second through via 420 may apply thermal stress to the second molding layer 320 due to difference in thermal conductivity, which may cause package warpage or may break the second molding layer 320. As the second through via 420 has a large width, it may be possible to increase efficiency of vertical heat transfer through the second through via 420.

Figure 2:
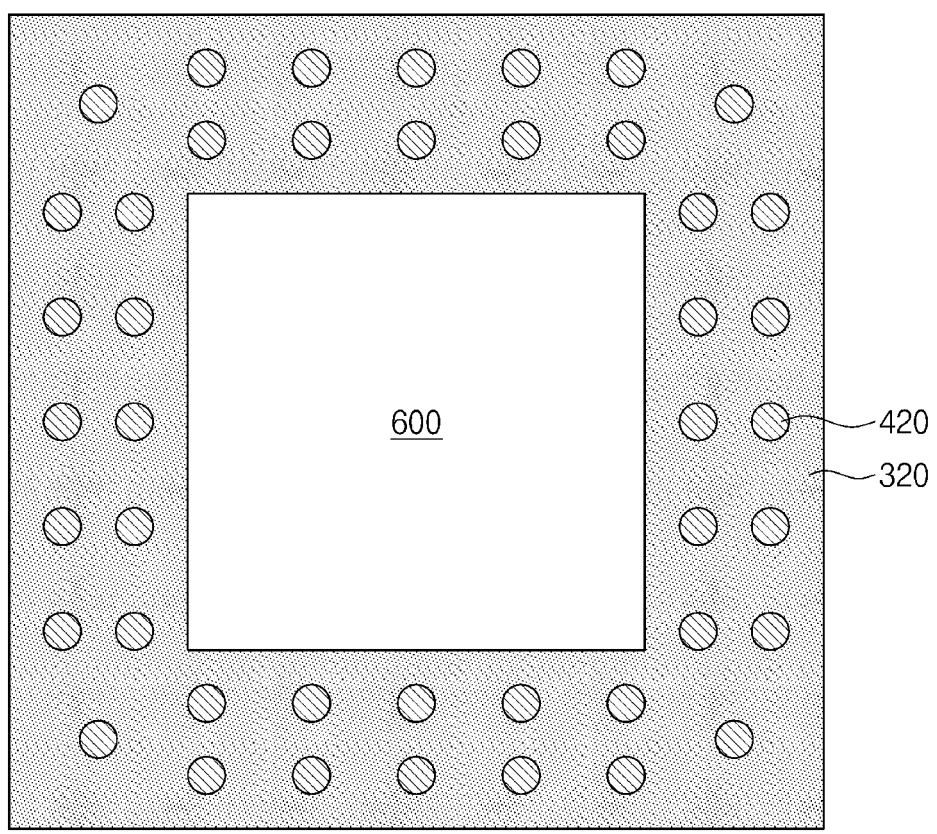
FIGS. 2 and 3 illustrate plan views showing a semiconductor package according to some embodiments of the present inventive concepts.
Figure 3:
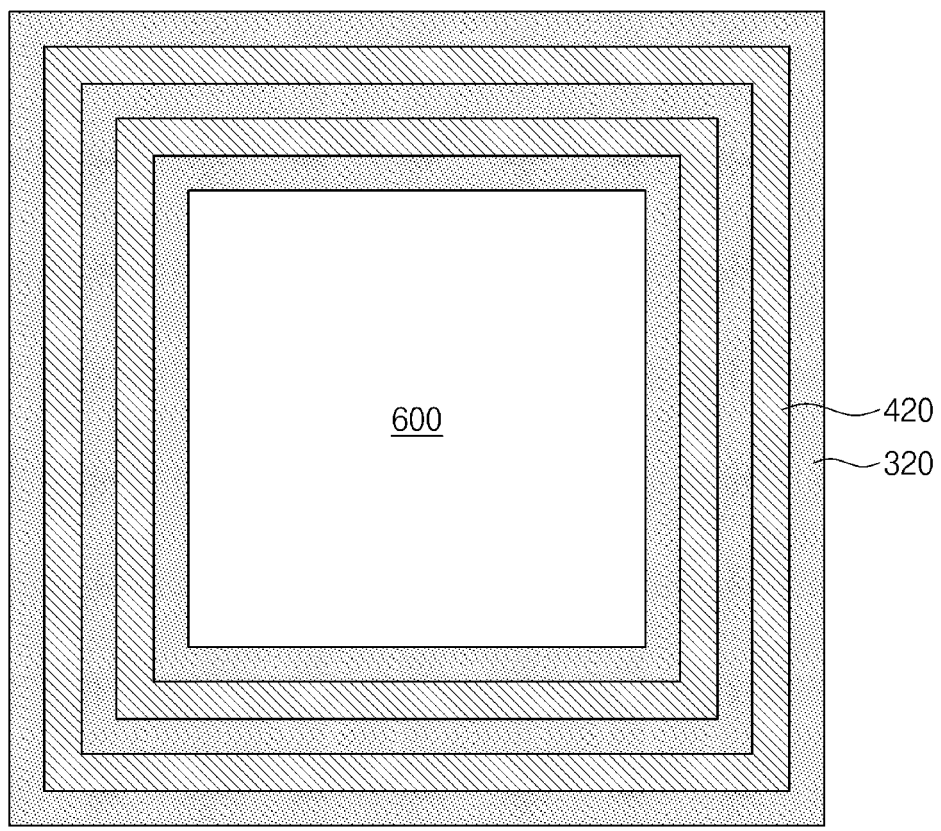

To improve heat transfer through the second through via 420, a plurality of second through vias 420 may be provided. FIGS. 2 and 3 illustrate plan views of a semiconductor package according to some embodiments of the present inventive concepts, showing a shape and arrangement of a second through via in a redistribution layer. As shown in FIG. 2, a plurality of second through vias 420 may be provided to surround the second semiconductor chip 600. The second through vias 420 may be disposed around and adjacent to the second semiconductor chip 600, and thus there may be a reduced length of heat transfer toward the second through vias 420 from central portions of the second semiconductor chip 600 and the second substrate 500. As the second through via 420 is provided in plural, there may be various paths of heat transfer from the second substrate 500 and an improvement in efficiency of vertical heat transfer through the second through vias 420. In some embodiments, when the semiconductor package is viewed in a plan view, the plurality of second through vias 420 may overlap the plurality of first through vias 410, respectively, so that each second through via covers a corresponding first through via. The present invention is not limited thereto. In some embodiments, when the semiconductor package is viewed in a plan view, the plurality of second through vias 420 may not overlap the plurality of first through vias 410, respectively so that each second through via does not cover a corresponding first through via. In some embodiments, when the semiconductor package is viewed in a plan view, at least one second through via may not overlap at least one corresponding first through via.

FIG. 2 depicts that the second through vias 420 have cylindrical shapes, but the present inventive concepts are not limited thereto. The second through vias 420 may have wall shapes on the second substrate 500 that extend in one direction on the top surface of the second substrate 500. For example, when viewed in a plan view as shown in FIG. 3, the second through vias 420 may have closed loop shapes each of which surrounds the second semiconductor chip 600. There may be a single second through via 420 or a plurality of second through vias 420 that surround each other. In some embodiments, the second through vias 420 may be a plurality of walls that extend along the lateral surfaces of the second semiconductor chip 600. In some embodiments, each second through via 420 may have a rectangular loop shape surrounding the second semiconductor chip 600. In some embodiments, the second through vias 420 may be concentric with each other. When the second through vias 420 have a wall shape, the second through vias 420 may partially shield electromagnetic waves that are transferred to the second semiconductor chip 600 from outside or to outside from the second semiconductor chip 600. Accordingly, a semiconductor package may improve in operating stability.

Figure 4:
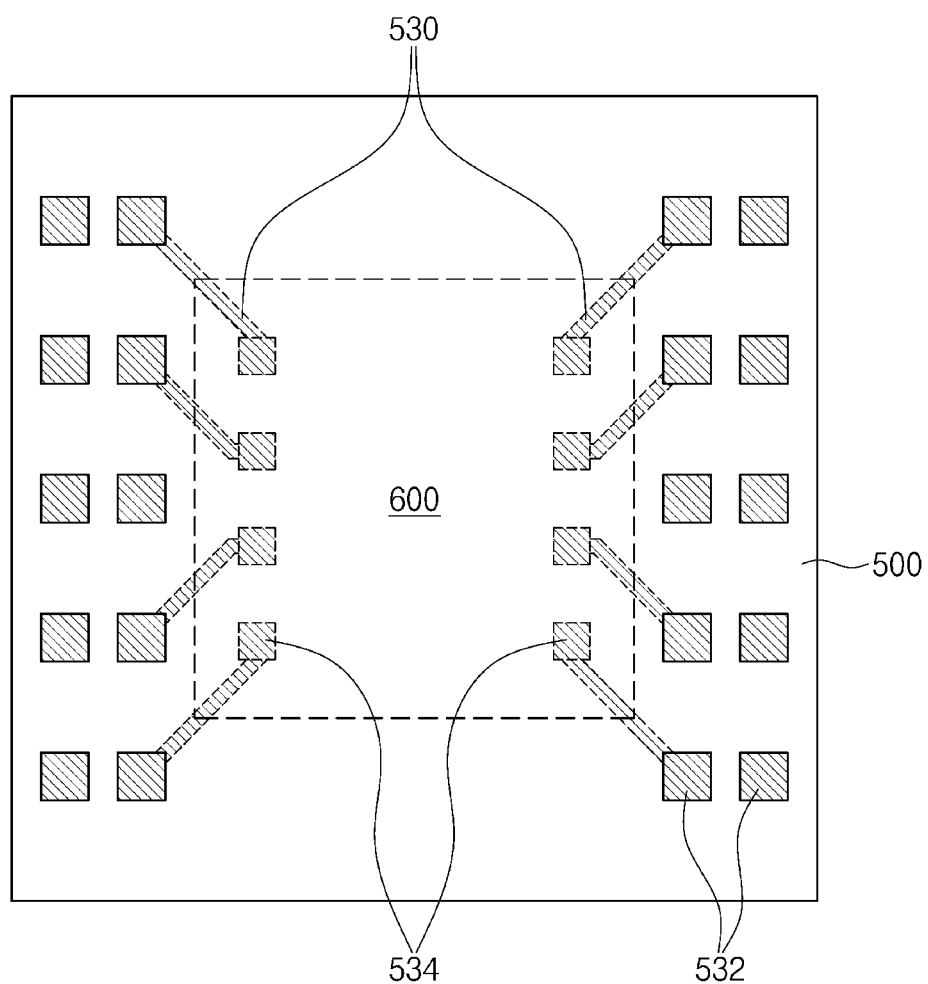
FIG. 4 illustrates a simplified plan view partially showing a redistribution layer.

To improve heat transfer in the second substrate 500, the dummy wiring pattern 530 of the second substrate 500 may have various planar shapes. FIG. 4 illustrates a simplified plan view of a second substrate, showing a dummy wiring pattern of a second substrate. For convenience of description, FIG. 4 depicts only a dummy wiring pattern among components of a second substrate, and shows horizontal extension of the dummy wiring pattern while omitting vertical connection of the dummy wiring pattern.

As shown in FIG. 4, the dummy wiring pattern 530 of the second substrate 500 may extend from below the second semiconductor chip 600 toward outside the second semiconductor chip 600. In some embodiments, the dummy wiring pattern 530 of the second substrate 500 may extend from a region below the second semiconductor chip 600 beyond one side of the second semiconductor chip 600. In some embodiments, the dummy wiring pattern 530 may have a planar shape that radially extends from a region below the second semiconductor chip 600 toward outside the second semiconductor chip 600. In some embodiments, the dummy wiring pattern 530 may have a bar shape that extends from a region below the second semiconductor chip 600 beyond one side of the second semiconductor chip 600.

For example, the one side of the second semiconductor chip 600 may extend in a first direction, and the bar shape of the dummy wiring pattern 530 may extend in a second direction different from the first direction. In some embodiments, a portion of the dummy wiring pattern 530 may be disposed at a region below a corner of the second semiconductor chip 600. The present inventive concepts, however, are not limited thereto. For example, the dummy wiring pattern 530 may extend from below the second semiconductor chip 600 toward lateral surfaces of the second substrate 500 along a direction orthogonal to the lateral surfaces of the second substrate 500. The dummy wiring pattern 530 may have various planar shapes that extend toward the fifth substrate pad 532 from below the second semiconductor chip 600. For example, the dummy wiring pattern 530 may have a first end 534 positioned below the second semiconductor chip 600. The dummy wiring pattern 530 may have a second end 532 that is positioned on one side of the second semiconductor chip 600 when viewed in a plan view and that serves as the fifth substrate pad 532. Heat generated from the first and second semiconductor chips 200 and 600 may be transferred along the dummy wiring pattern 530 from the first end 534 to the second end 532 of the dummy wiring pattern 530 adjacent to the second semiconductor chip 600. The second substrate 500 may be provided with heat, whose amount is larger at a central portion of the second substrate 500 than at an edge portion of the second substrate 500, from the first semiconductor chip 200 and the second semiconductor chip 600 that overlap the central portion of the second substrate 500, and the heat on the central portion of the second substrate 500 may be transferred through the dummy wiring pattern 530 to the second through via 420 provided on an outer portion of the second substrate 500. The dummy wiring pattern 530 may be formed of metal whose thermal conductivity is high, and there may be high efficiency of heat transfer from the second semiconductor chip 600 toward the second through via 420. For example, heat may be easily discharged through the second substrate 500 and the second through via 420 from the first semiconductor chip 200 and the second semiconductor chip 600, and a semiconductor package may improve in thermal stability and operating reliability.

Figure 5:
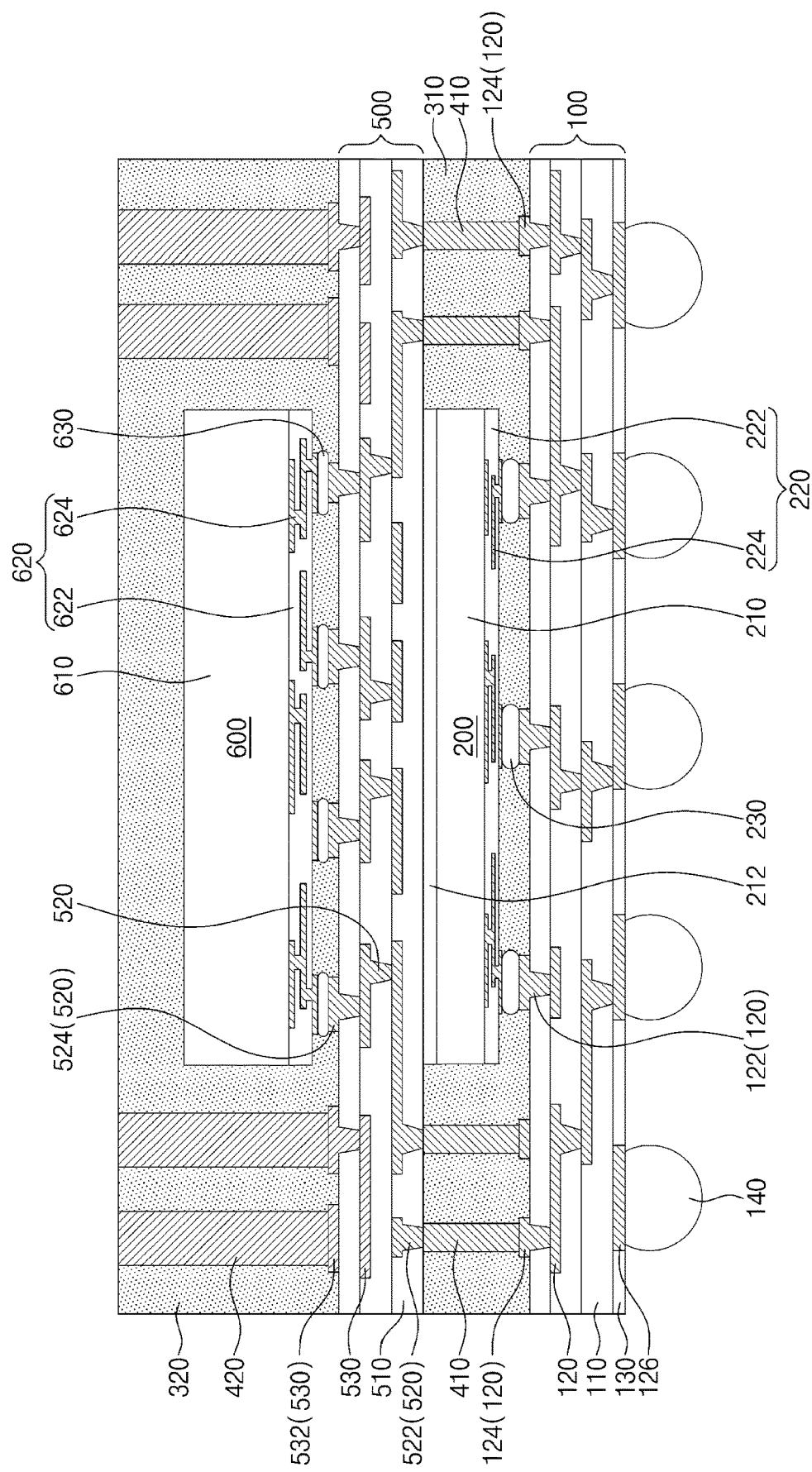
FIGS. 5 to 9 illustrate cross-sectional views showing a semiconductor package according to some embodiments of the present inventive concepts.

FIG. 5 illustrates a cross-sectional view showing a semiconductor package according to some embodiments of the present inventive concepts. In the embodiments that follow, components that are the same as those discussed with reference to FIGS. 1 to 4 are referred to using the same reference numerals, and a repetitive explanation thereof will be omitted or abridged for convenience of description. The following description will focus on differences between the embodiments of FIGS. 1 to 4 and other embodiments discussed below.

Referring to FIG. 5, the first molding layer 310 may not cover a top surface of the first semiconductor chip 200. The first semiconductor chip 200 may be attached to a bottom surface of the second substrate 500 through a first heat transfer layer 212 provided on the top surface of the first semiconductor chip 200. The first heat transfer layer 212 may have a top surface coplanar with that of the first molding layer 310. The first heat transfer layer 212 may include or may be formed of a thermal interface material (TIM) such as thermal grease. The first heat transfer layer 212 may transfer heat from the first semiconductor chip 200 to the second substrate 500, and the second through via 420 and the dummy wiring pattern 530 of the second substrate 500 may effectively outwardly discharge heat that is transferred through the first heat transfer layer 212 from the first semiconductor chip 200.

Figure 6:
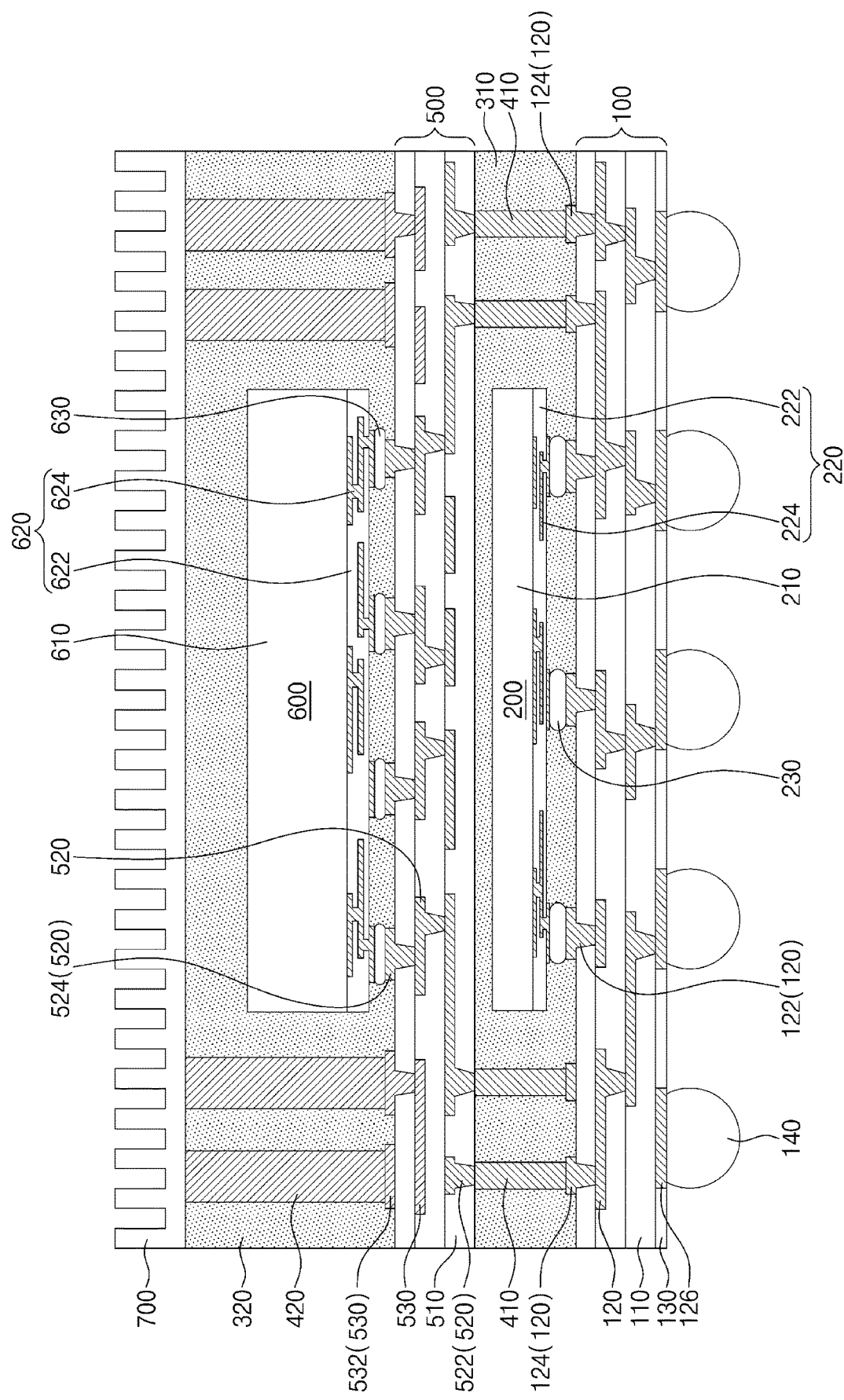
Figure 7:
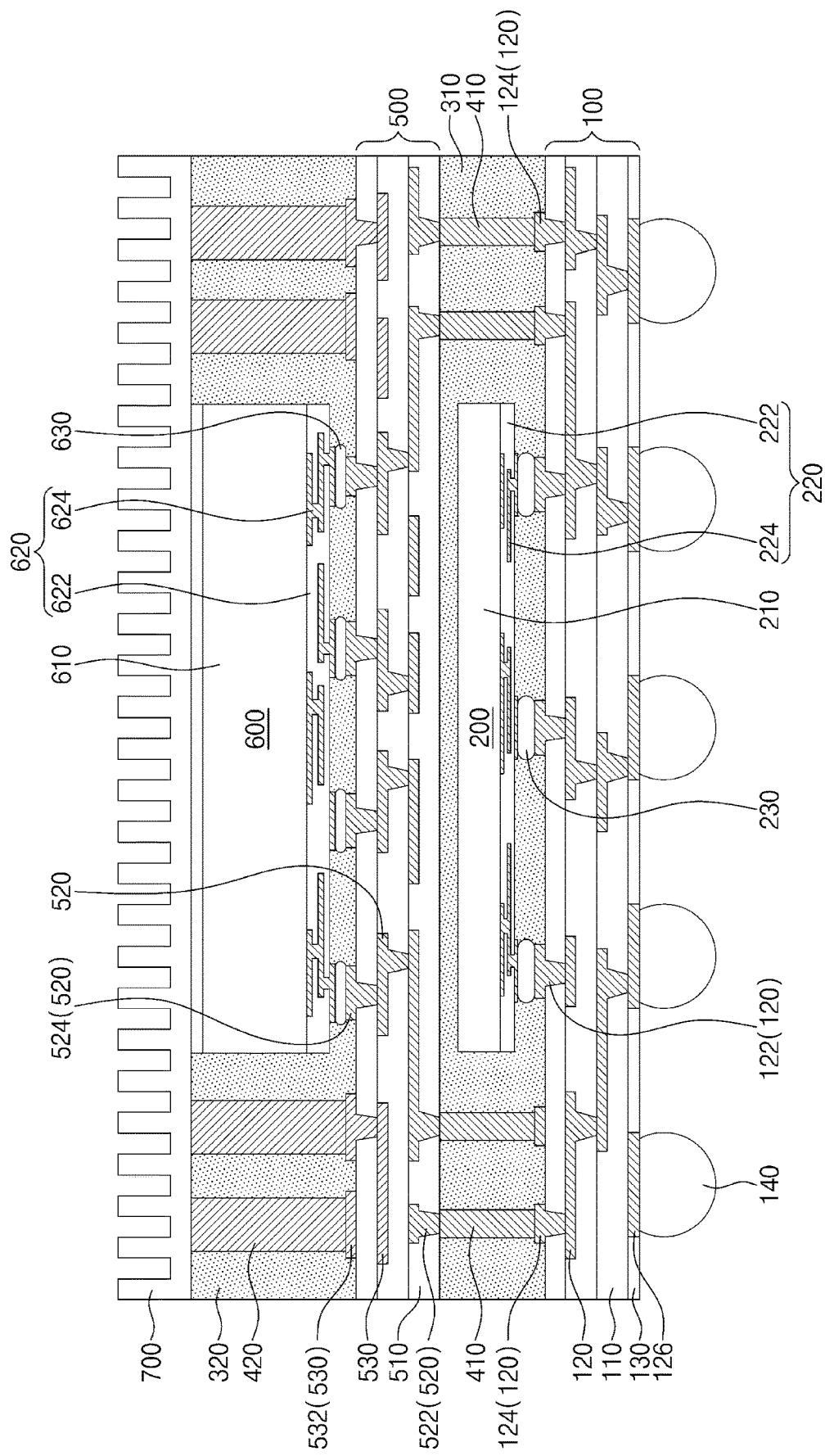

FIGS. 6 and 7 illustrate cross-sectional views showing a semiconductor package according to some embodiments of the present inventive concepts.

Referring to FIG. 6, a heat radiator 700 may be provided on the second molding layer 320. For example, the heat radiator 700 may contact a top surface of the second molding layer 320 and a top surface of the second through via 420. Although not shown, the heat radiator 700 may be attached thorough an adhesion film to the second molding layer 320. The adhesion film may include or may be formed of a thermal interface material (TIM) such as thermal grease. The heat radiator 700 may outwardly discharge heat transferred from the second through via 420. The heat radiator 700 may include or may be a heat sink. In some embodiments, the heat radiator 700 may be electrically floating. In some embodiments, the heat radiator 700 may be electrically grounded. As the heat radiator 700 is connected to the second through via 420, heat transfer to the heat radiator 700 may be efficiently facilitated through the second through via 420.

According to some embodiments, the heat radiator 700 may be attached to the second semiconductor chip 600. Referring to FIG. 7, the second molding layer 320 may not cover a top surface of the second semiconductor chip 600. The second semiconductor chip 600 may be attached to a bottom surface of the heat radiator 700 through a second heat transfer layer 612 provided on the top surface of the second semiconductor chip 600. The second heat transfer layer 612 may have a top surface coplanar with that of the second molding layer 320. The second heat transfer layer 612 may include or may be formed of a thermal interface material (TIM) such as thermal grease. The second heat transfer layer 612 may directly transfer heat from the second semiconductor chip 600 to the heat radiator 700, and the heat generated from the second semiconductor chip 600 may be effectively outwardly discharged.

Figure 8:
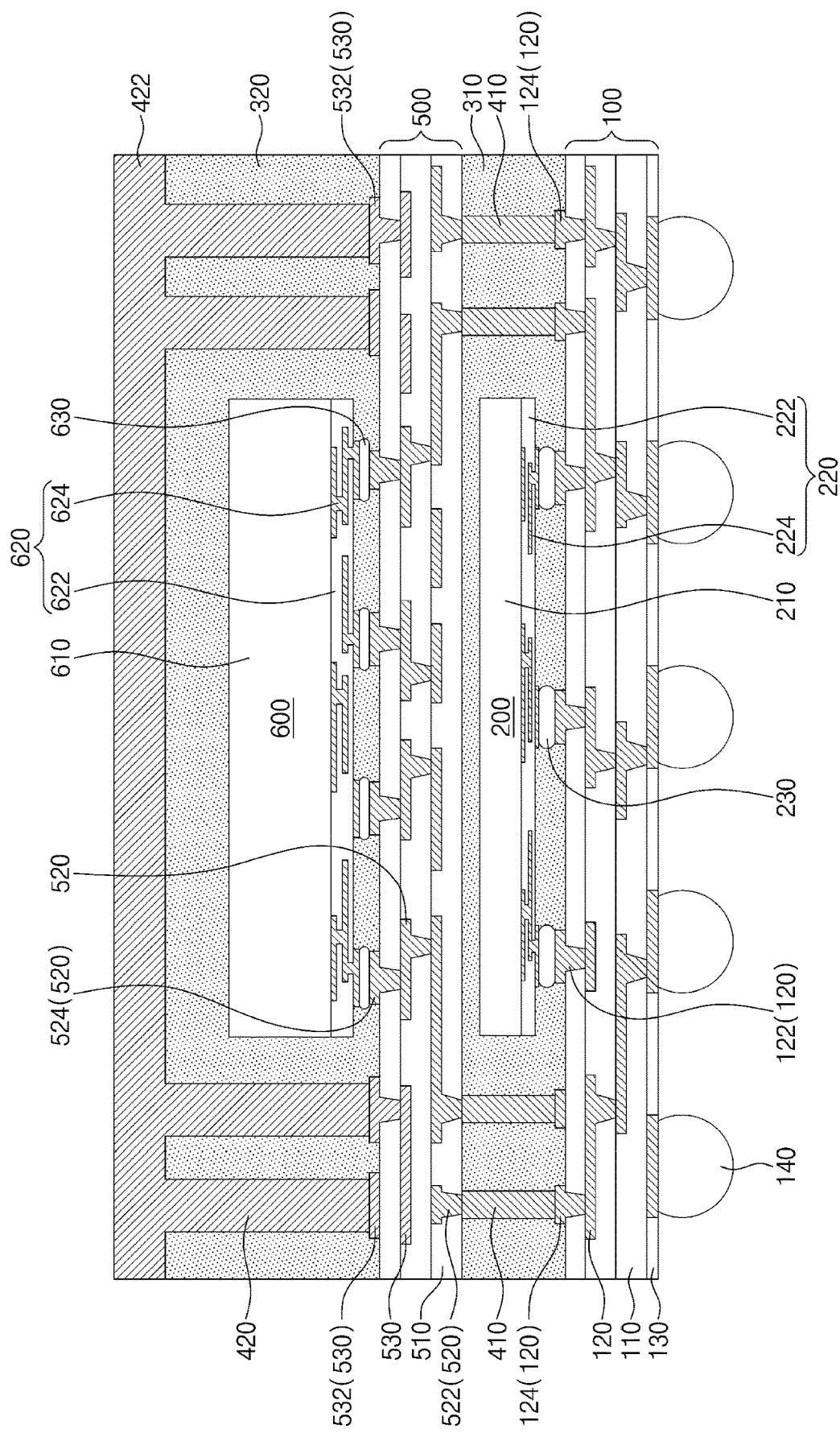

FIG. 8 illustrates a cross-sectional view showing a semiconductor package according to some embodiments of the present inventive concepts.

Referring to FIG. 8, the second through via 420 may have an extension 422 that extends onto a top surface of the second molding layer 320. The extension 422 may cover the top surface of the second molding layer 320. The extension 422 may serve as a heat radiator or a heat sink which is similar to the heat radiator 700 as discussed with reference to FIG. 6 or 7. For example, the extension 422 may have a top surface exposed to air, and heat transferred to the second through via 420 may be outwardly discharged through the top surface of the extension 422. The second through via 420 and its extension 422 formed of metal may partially shield electromagnetic waves that are transferred to the second semiconductor chip 600 from outside or to outside from the second semiconductor chip 600. Accordingly, a semiconductor package may improve in operating stability.

Figure 9:
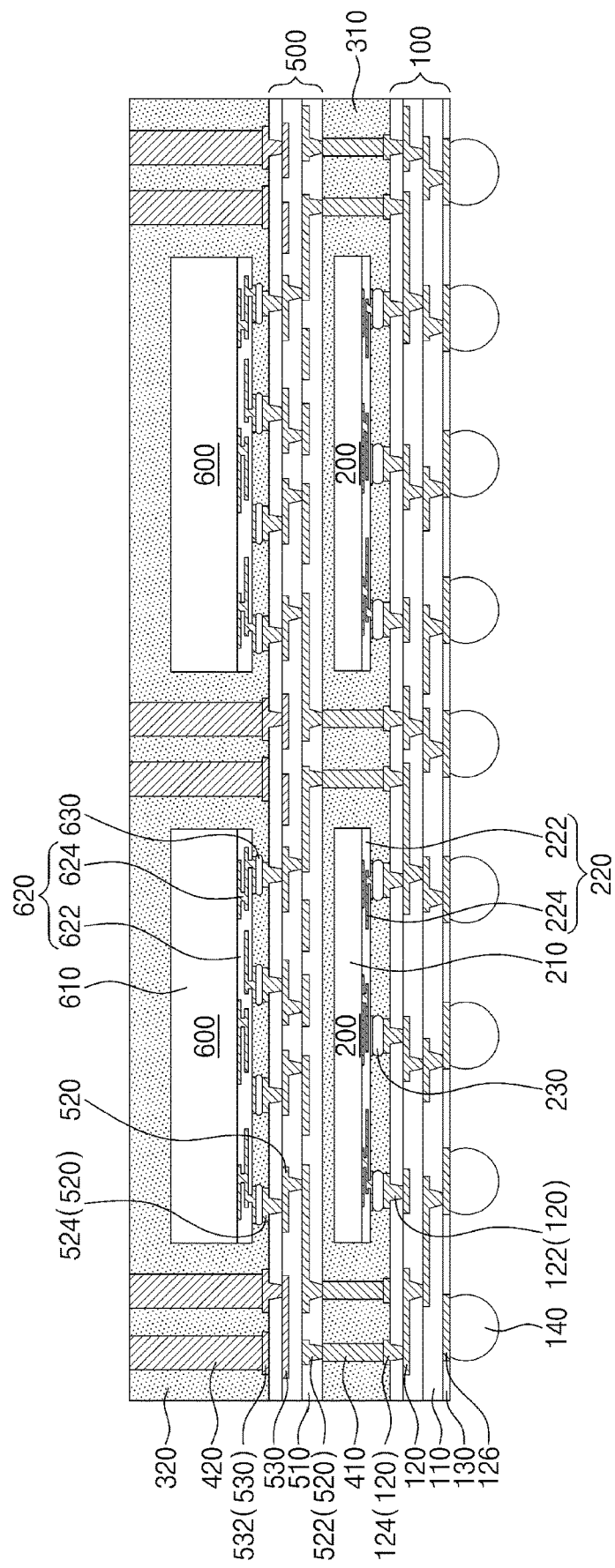
Figure 10:
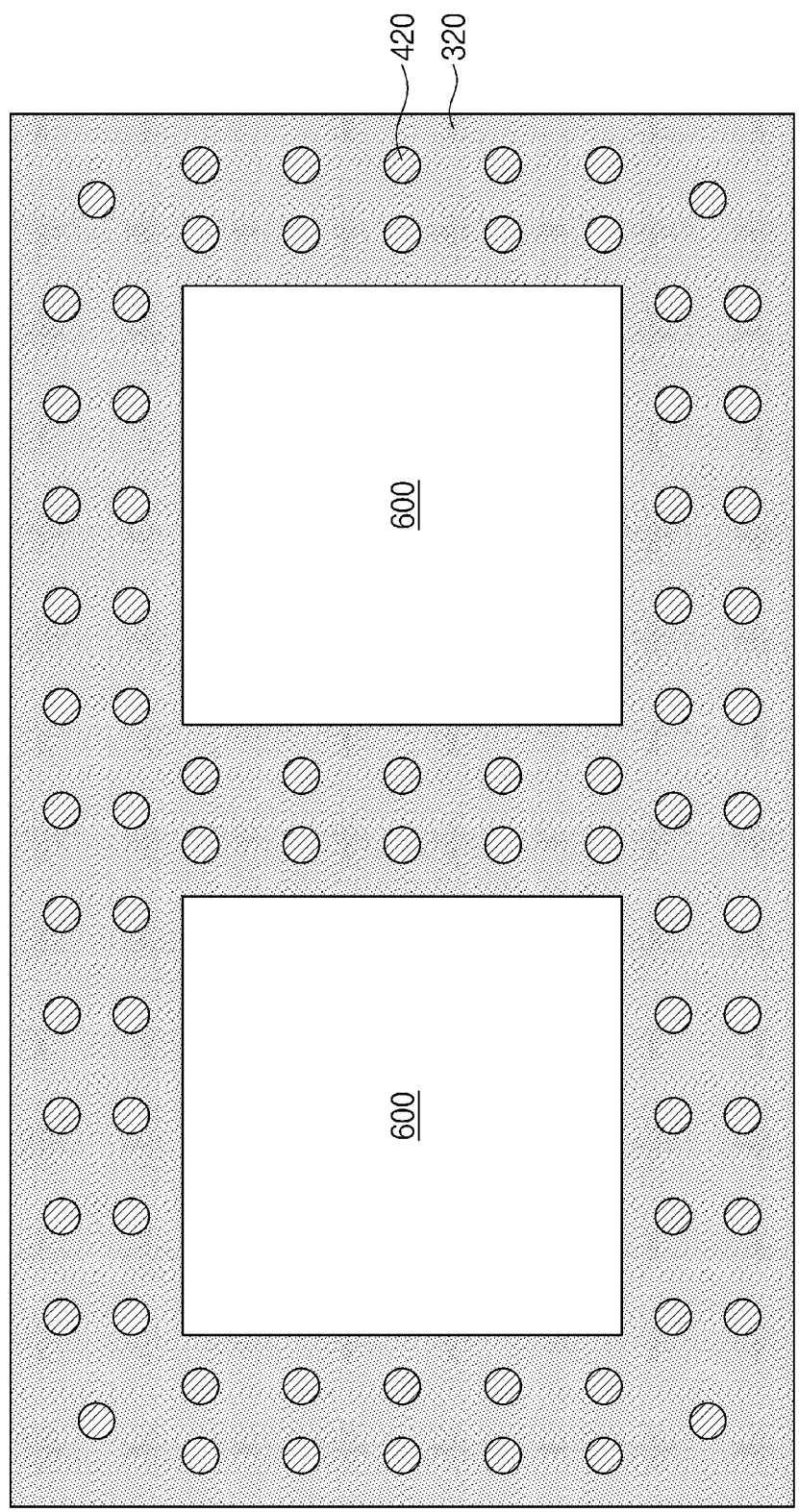
FIGS. 10 and 11 illustrate plan views showing a semiconductor package according to some embodiments of the present inventive concepts.
Figure 11:
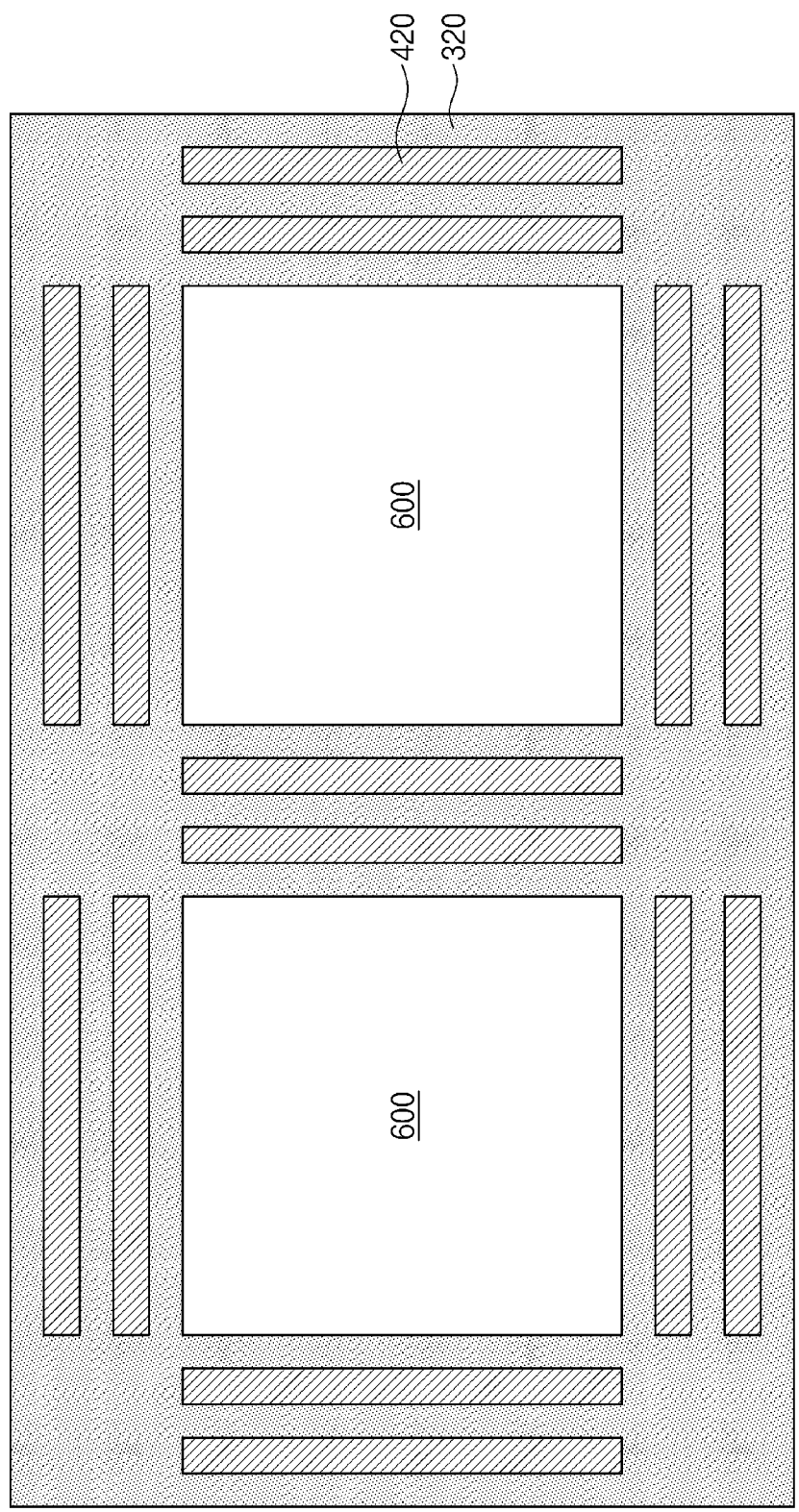

FIG. 9 illustrates a cross-sectional view showing a semiconductor package according to some embodiments of the present inventive concepts. FIGS. 10 and 11 illustrate plan views showing a semiconductor package according to some embodiments of the present inventive concepts.

Referring to FIG. 9, each of the first and second semiconductor chips 200 and 600 may be provided in plural.

The plurality of first semiconductor chips 200 may be mounted on the first substrate 100. The first semiconductor chips 200 may be disposed spaced apart from each other on the first substrate 100. The first through vias 410 may be provided on the first substrate 100. The first through vias 410 may be beside of the first semiconductor chips 200 and/or between the first semiconductor chips 200.

The plurality of second semiconductor chips 600 may be mounted on the second substrate 500. The second semiconductor chips 600 may be disposed spaced apart from each other on the second substrate 500. The second through vias 420 may be provided on the second substrate 500. The second through vias 420 may be adjacent to the second semiconductor chips 600 and/or between the second semiconductor chips 600.

As shown in FIG. 10, the second through vias 420 may have pillar shapes that vertically penetrate the second molding layer 320. The second through vias 420 may be disposed to surround the second semiconductor chips 600. Some of the second through vias 420 may be disposed between the second semiconductor chips 600. The second through vias 420 around the second semiconductor chips 600 may partially shield electromagnetic waves that are transferred outwardly. The second through vias 420 between the second semiconductor chips 600 may shield electromagnetic waves between the second semiconductor chips 600.

According to some embodiments, as shown in FIG. 11, the second through vias 420 may have bar shapes. The second through vias 420 may extends along lateral surfaces of the second semiconductor chips 600. The second through vias 420 between the second semiconductor chips 600 may extend across between the second semiconductor chips 600. In some embodiments, the second through vias 420 between two adjacent second semiconductor chips 600 may extend in a first direction, and the two adjacent second semiconductor chip 600 may be spaced apart from each other in a second direction different from the first direction. The second through vias 420 may efficiently shield electromagnetic wave. Accordingly, a semiconductor package may improve in operating stability. FIG. 11 depicts that the second through vias 420 are provided on lateral surfaces of the second semiconductor chips 600, but the present inventive concepts are not limited thereto. In some embodiments, as described with reference to FIG. 3, when viewed in a plan view, the second through vias 420 may have closed loop shapes that surround the second semiconductor chips 600.

Figure 12:
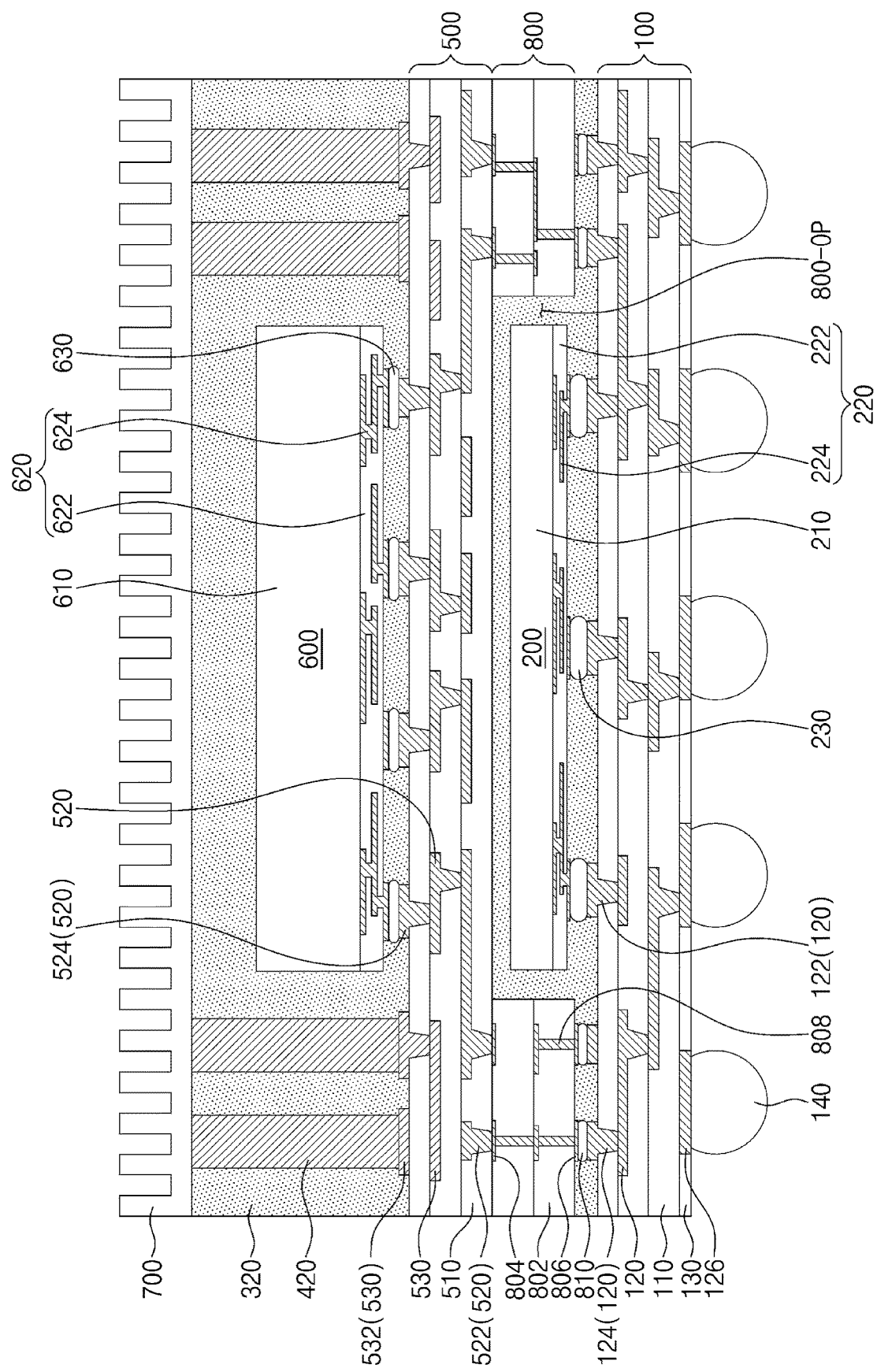
FIG. 12 illustrates a cross-sectional view showing a semiconductor package according to some embodiments of the present inventive concepts.

FIG. 12 illustrates a cross-sectional view showing a semiconductor package according to some embodiments of the present inventive concepts.

Referring to FIG. 12, a semiconductor package may further include a connection substrate 800. For example, the connection substrate 800 may be provided to replace the first through via (see 410 of FIG. 1). The connection substrate 800 may include substrate vias 808, or vertical connection members that correspond to the first through vias 410.

The connection substrate 800 may include an opening 800-OP that penetrates therethrough. For example, the opening 800-OP may be shaped like an open hole that connects top and bottom surfaces of the connection substrate 800. The bottom surface of the connection substrate 800 may be spaced apart from a top surface of the first substrate 100. The connection substrate 800 may further include a substrate base layer 802 and a conductive part that is a wiring pattern provided in the substrate base layer 802. For example, the substrate base layer 802 may include or may be formed of silicon oxide. The conductive part may be disposed in a portion of the substrate base layer 802 between the opening 800-OP and an outer portion of the connection substrate 800. The conductive part may include substrate upper pads 804, substrate lower pads 806, and substrate vias 808. The substrate upper pads 804 may be disposed on an upper portion of the connection substrate 800. The substrate lower pads 806 may be disposed on the bottom surface of the connection substrate 800. The substrate vias 808 may penetrate the substrate base layer 802 and may electrically connect the substrate lower pads 806 to the substrate upper pads 804. In some embodiments, the opening 800-OP may penetrate the substrate base layer 802. In some embodiments, the opening 800-OP may penetrate a center region of the substrate base layer 802, and the conductive part may be disposed between the opening 800-OP and an outer portion of the substrate base layer 802 that is the outer portion of the connection substrate 800.

The connection substrate 800 may be mounted on the first substrate 100. For example, the connection substrate 800 may be connected to the second substrate pad 124 of the first substrate 100 through connection substrate terminals 810 provided on the substrate lower pads 806. Therefore, the connection substrate 800 may be electrically connected to the first semiconductor chip 200 and the external terminals 140.

The first semiconductor chip 200 may be disposed on the first substrate 100. The first semiconductor chip 200 may be disposed in the opening of the connection substrate 800.

The first molding layer 310 may fill a gap between the connection substrate 800 and the first semiconductor chip 200. The first molding layer 310 may surround the first semiconductor chip 200 in the opening and may cover a top surface of the first semiconductor chip 200. The first molding layer 310 may expose the top surface of the connection substrate 800. The first molding layer 310 may fill a gap between the first substrate 100 and the connection substrate 800.

The second substrate 500 may be coupled to the connection substrate 800. For example, the tail part of a lowermost redistribution pattern 522 in the second substrate 500 may penetrate the second substrate dielectric pattern 510 of a lowermost second substrate wiring layer and may be coupled to the substrate upper pad 804 of the connection substrate 800.

A heat radiator 700 may be provided on the second molding layer 320. For example, the heat radiator 700 may contact a top surface of the second molding layer 320 and a top surface of the second through via 420. Although not shown, the heat radiator 700 may be attached thorough an adhesion film to the second molding layer 320. The heat radiator 700 may outwardly discharge heat transferred from the second through via 420.

FIGS. 13 to 21 illustrate cross-sectional views showing a method of fabricating a semiconductor package according to some embodiments of the present inventive concepts.

Figure 13:
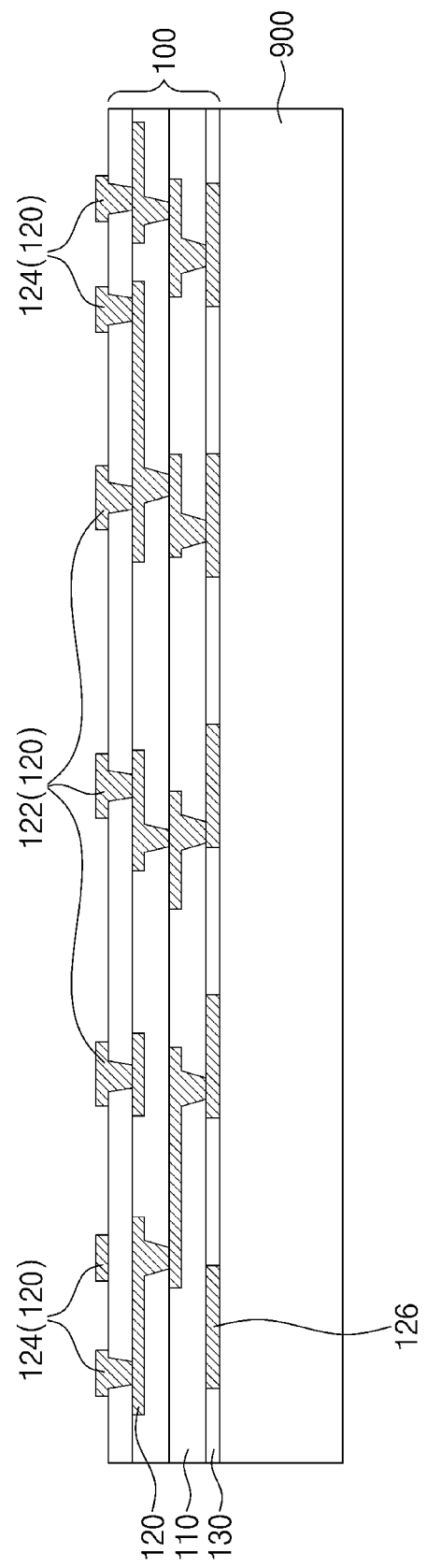
FIGS. 13 to 25 illustrate cross-sectional views showing a method of fabricating a semiconductor package according to some embodiments of the present inventive concepts.

Referring to FIG. 13, a carrier substrate 900 may be provided. The carrier substrate 900 may be a dielectric substrate including glass or polymer, or may be a conductive substrate including metal. Although not shown, the carrier substrate 900 may be provided with an adhesive member on a top surface thereof. For example, the adhesive member may include or may be a glue tape.

A first substrate 100 may be formed on the carrier substrate 900. The following will describe in detail the formation of the first substrate 100.

A lower dielectric layer 130 may be provided on the carrier substrate 900. The lower dielectric layer 130 may include or may be formed of a dielectric polymer or a photo-imageable dielectric. The lower dielectric layer 130 may correspond to the substrate passivation layer 130 discussed with reference to FIG. 1.

One or more third substrate pads 126 may be formed in the lower dielectric layer 130. For example, the lower dielectric layer 130 may be patterned to form openings for forming the third substrate pads 126, and a seed layer may be conformally formed in the openings, and then performing a plating process in which the seed layer is used as a seed to form the third substrate pads 126 that fill the openings.

A first substrate dielectric pattern 110 may be formed on the lower dielectric layer 130. The first substrate dielectric pattern 110 may be formed by a coating process such as spin coating and slit coating. The first substrate dielectric pattern 110 may include or may be formed of a photo-imageable dielectric (PID). For example, the photo-imageable dielectric may include or may be formed of at least one selected from photosensitive polyimide, polybenzoxazole (PBO), phenolic polymers, and benzocyclobutene polymers.

Openings may be formed in the first substrate dielectric pattern 110. For example, the first substrate dielectric pattern 110 may be patterned to form the openings. Each of the openings may have a T-shaped cross section. The openings may expose the third substrate pads 126.

A first substrate wiring pattern 120 may be formed. For example, a barrier layer and a conductive layer may be formed on the first substrate dielectric pattern 110 so as to fill the openings, and then the barrier layer and the conductive layer may undergo a planarization process to form the first substrate wiring pattern 120.

As such, the first substrate wiring layer may be formed to include the first substrate dielectric pattern 110 and the first substrate wiring pattern 120. The formation of the first substrate wiring layer may be repeated to form the first substrate 100 in which the first substrate wiring layers are stacked on each other. The first substrate wiring pattern 120 of the first substrate wiring layer at top position may correspond to a first substrate pad 122 and a second substrate pad 124 of the first substrate 100.

Figure 14:
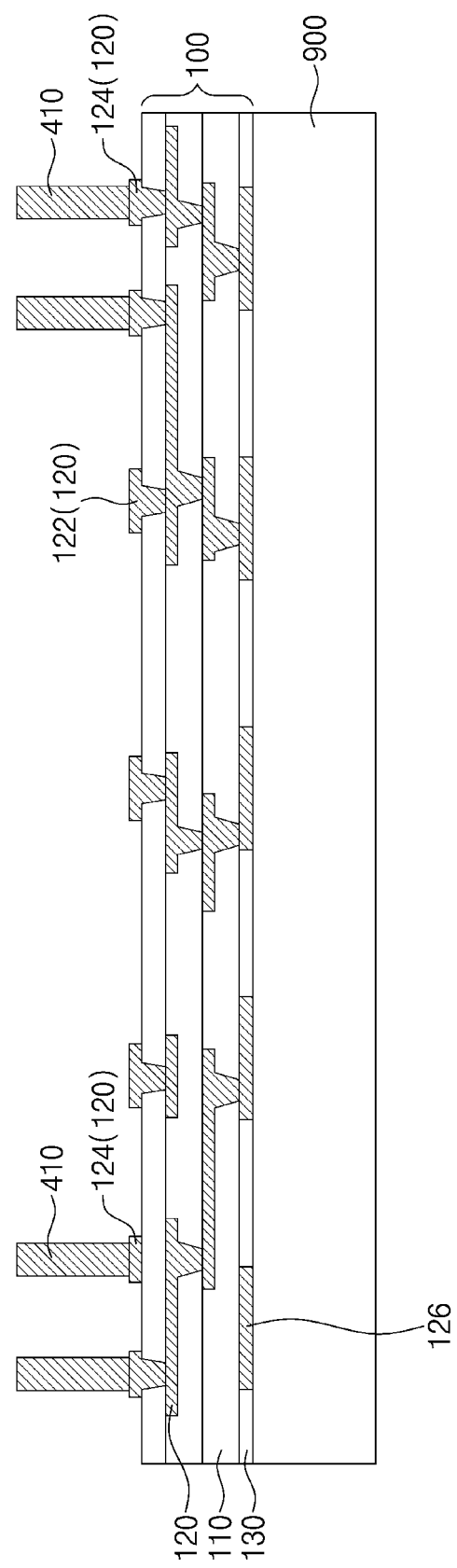

Referring to FIG. 14, a first through via 410 may be formed on the first substrate 100. For example, a sacrificial layer may be formed on the first substrate 100. The sacrificial layer may cover a top surface of the first substrate 100. The sacrificial layer may include or may be formed of, for example, a photoresist material. The sacrificial layer may undergo an etching process to form a via hole that penetrates the sacrificial layer and exposes the second substrate pad 124. Afterwards, the via hole may be filled with a conductive material to form the first through via 410. The sacrificial layer may be subsequently removed.

Figure 15:
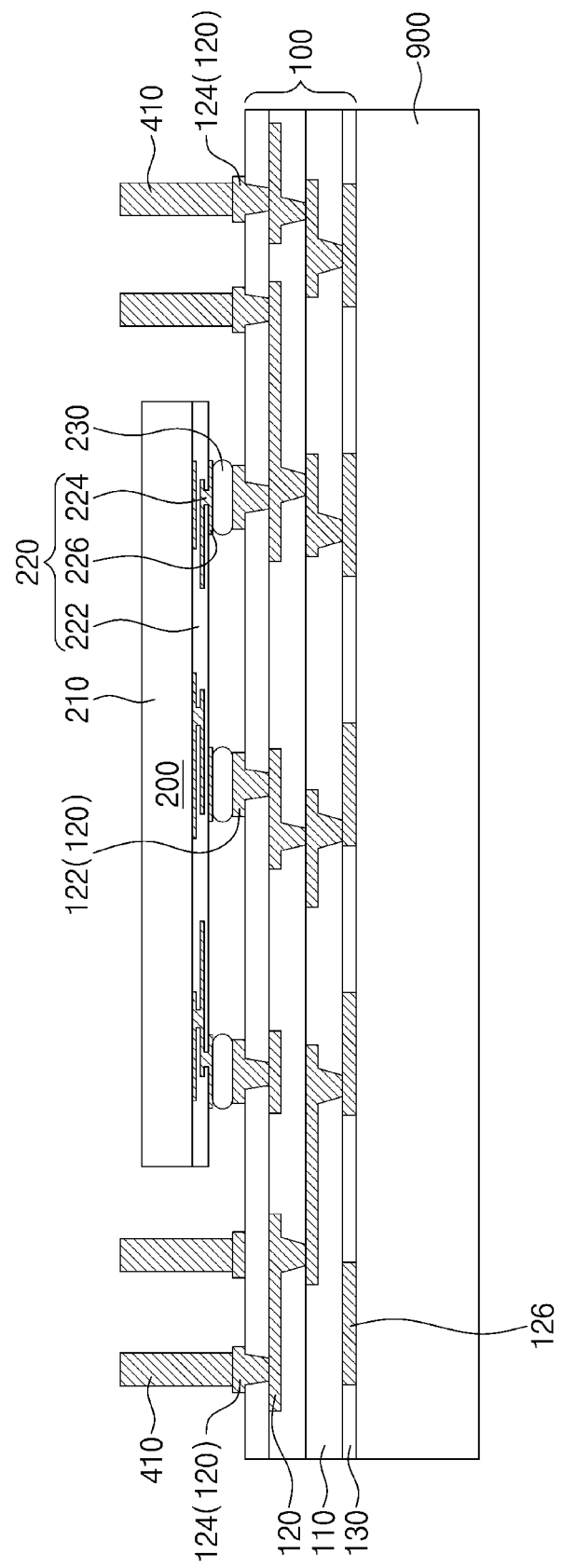

Referring to FIG. 15, a first semiconductor chip 200 may be provided. The first semiconductor chip 200 may have a configuration that is the same as or similar to that discussed with reference to FIG. 1. For example, the first semiconductor chip 200 may include a first base layer 210 and a first circuit layer 220 that is provided on an active surface of the first base layer 210.

The first semiconductor chip 200 may be mounted on the first substrate 100. A first chip terminal 230 may be provided on a first chip pad 226 of the first semiconductor chip 200. The first semiconductor chip 200 may be aligned to place the first chip terminal 230 of the first substrate 100 on the first substrate pad 122, and then a reflow process may be performed to connect the first chip terminal 230 to the first substrate pad 122.

Figure 16:
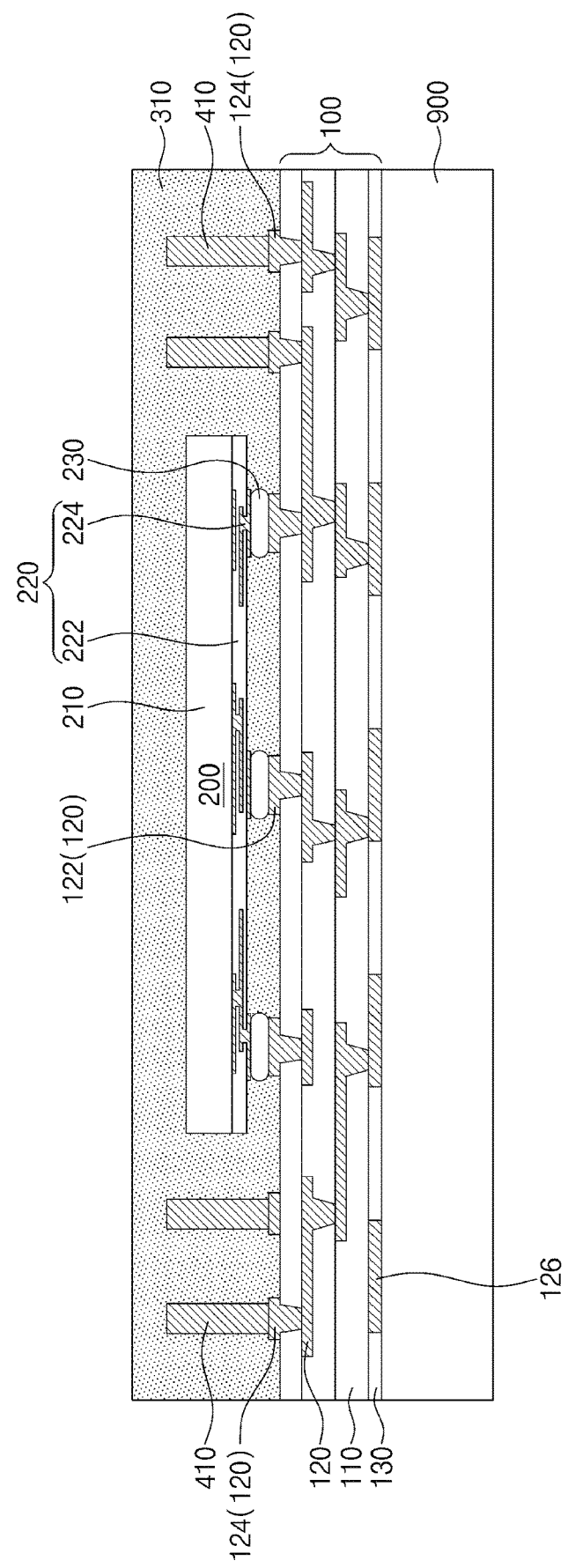

Referring to FIG. 16, a first molding layer 310 may be formed on the first substrate 100. For example, the first substrate 100 may be coated on a top surface with a dielectric molding material to encapsulate the first semiconductor chip 200. The molding material may be cured to form the first molding layer 310. The first molding layer 310 may cover lateral and top surfaces of the first semiconductor chip 200. The first molding layer 310 may surround the first through via 410. The first through via 410 may be embedded in the first molding layer 310.

Figure 17:
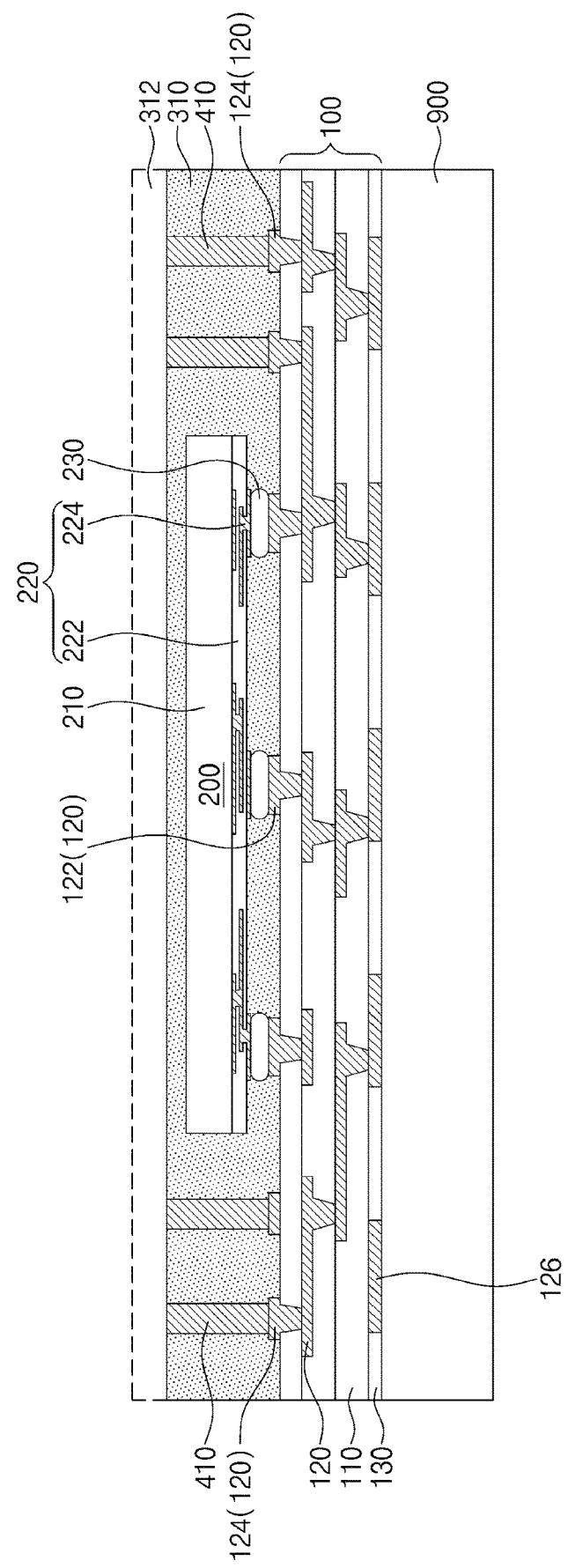

Referring to FIG. 17, an upper portion 312 of the first molding layer 310 may be removed. In detail, the first molding layer 310 may undergo a thinning process. For example, a grinding process or a chemical mechanical polishing (CMP) process may be performed on a top surface of the first molding layer 310. Therefore, the top surface of the first molding layer 310 may become flat. The thinning process may be executed to expose a top surface of the first through via 410. The thinning process may remove the upper portion 312 of the first molding layer 310, and as needed may also remove an upper portion of the first through via 410. After the thinning process, the top surface of the first through via 410 may be exposed. The first through via 410 and the first molding layer 310 may have top surfaces that form substantially flat coplanar surfaces. According to some embodiments, the thinning process may be performed to expose the first through via 410 and the first semiconductor chip 200 to fabricate a semiconductor package as discussed with reference to FIG. 5.

Figure 18:
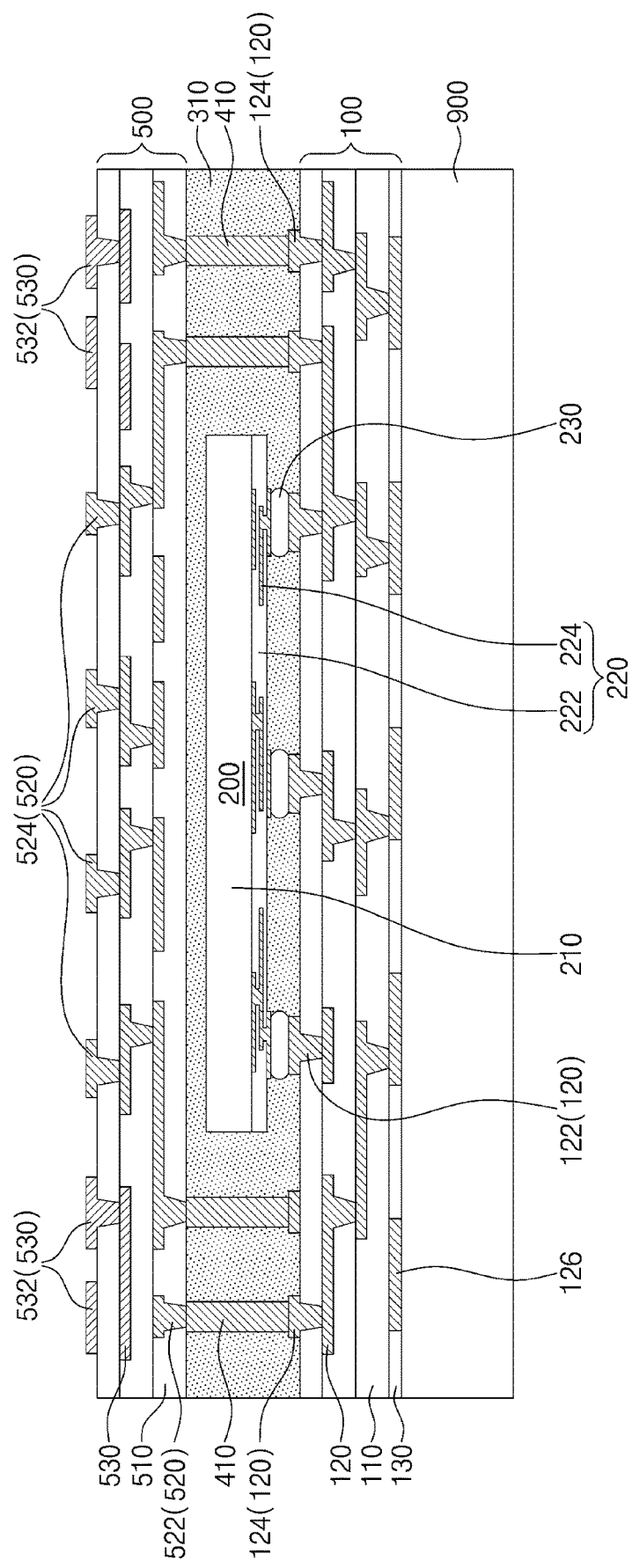

Referring to FIG. 18, a second substrate 500 may be formed on the first molding layer 310. For example, a second substrate dielectric pattern 510 may be formed on the first molding layer 310. The second substrate dielectric pattern 510 may include or may be formed of a dielectric polymer or a photo-imageable dielectric (PID). The second substrate dielectric pattern 510 may include second substrate wiring patterns 520 and 530 formed therein. For example, the second substrate dielectric pattern 510 may be patterned to from openings for forming the second substrate wiring patterns 520 and 530, conformally forming a seed layer in the openings, and then performing a plating process in which the seed layer is used as a seed to form the second substrate wiring patterns 520 and 530 that fill the openings. The second substrate wiring patterns 520 and 530 may include a redistribution pattern 520 and a dummy wiring pattern 530. One of the openings may expose the first through via 410. Therefore, the redistribution pattern 520 of the second substrate wiring patterns 520 and 530 may be coupled to the first through via 410. As such, a single second substrate wiring layer may be formed.

Another second substrate dielectric pattern 510 may be formed on the second substrate wiring layer that has been formed. The second substrate dielectric pattern 510 may be formed by a coating process such as spin coating and slit coating. The second substrate dielectric pattern 510 may include or may be formed of a photo-imageable dielectric (PID). The second substrate dielectric pattern 510 may be patterned to from openings that expose the second substrate wiring patterns 520 and 530 of the second substrate wiring layer provided below the second substrate dielectric pattern 510, conformally forming a seed layer in the openings, and then performing a plating process in which the seed layer is used as seed to form second substrate wiring patterns 520 and 530 that fill the openings. As discussed above, other second substrate wiring layers may be formed on the second substrate wiring layer. The redistribution pattern 520 of the second substrate wiring layer at top position may be exposed at a top surface of the second substrate dielectric pattern 510, and an exposed portion of the uppermost redistribution pattern 520 may correspond to a fourth substrate pad 524 of the second substrate 500. The dummy wiring pattern 530 of the second substrate wiring layer at top position may be exposed at the top surface of the second substrate dielectric pattern 510, and an exposed portion of the uppermost dummy wiring layer 530 may correspond to a fifth substrate pad 532 of the second substrate 500.

An example of the formation of the second substrate 500 is described above, but the present inventive concepts are not limited thereto.

Figure 19:
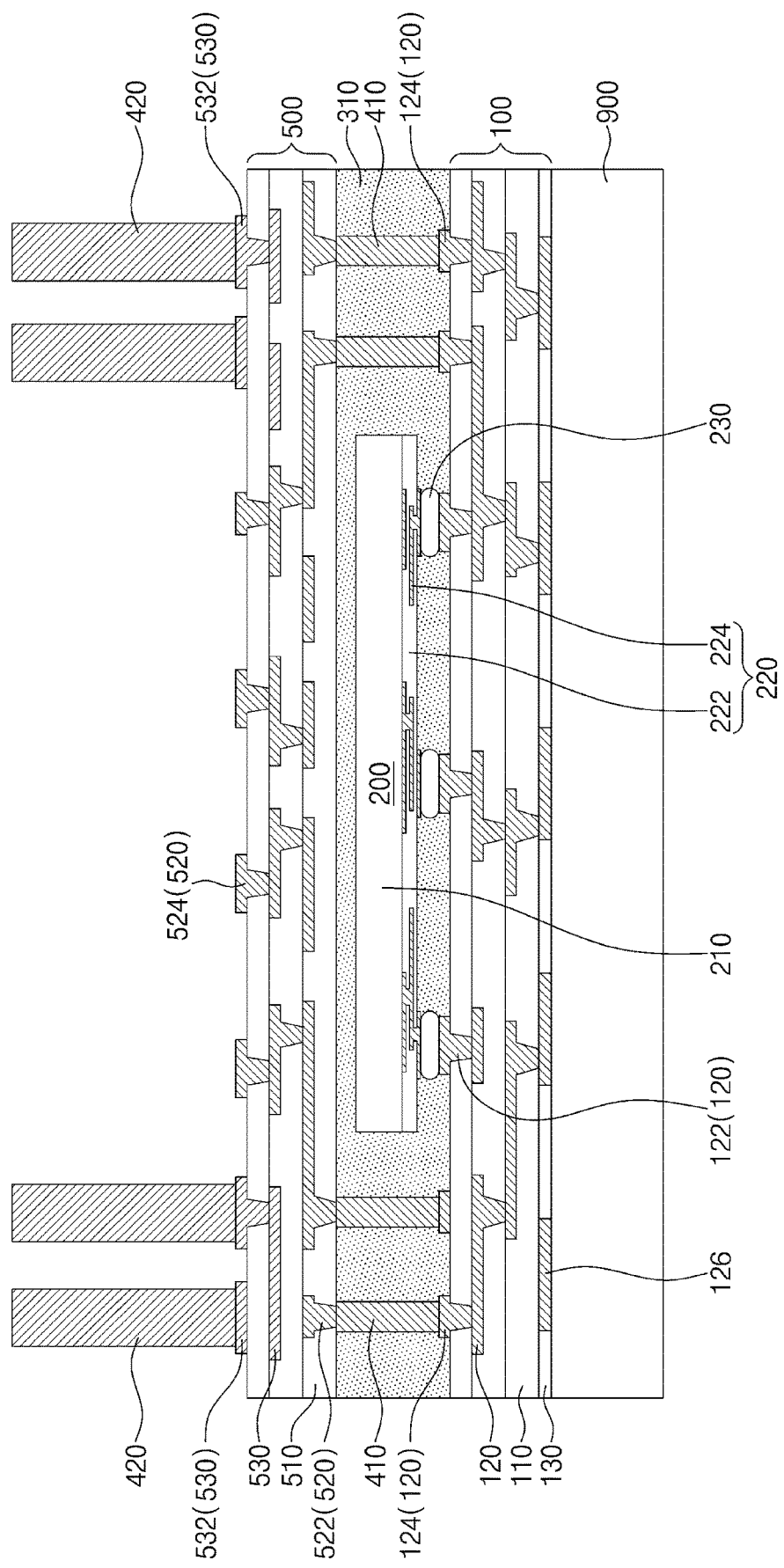

Referring to FIG. 19, a second through via 420 may be formed on the second substrate 500. For example, a sacrificial layer may be formed on the second substrate 500. The sacrificial layer may cover a top surface of the second substrate 500. The sacrificial layer may include, for example, a photoresist material. The sacrificial layer may undergo an etching process to form a via hole that penetrates the sacrificial layer and exposes the fifth substrate pad 532. The via hole may have a width greater than that of the first through via 410. Afterwards, the via hole may be filled with a conductive material to form the second through via 420. The sacrificial layer may be subsequently removed.

Figure 20:
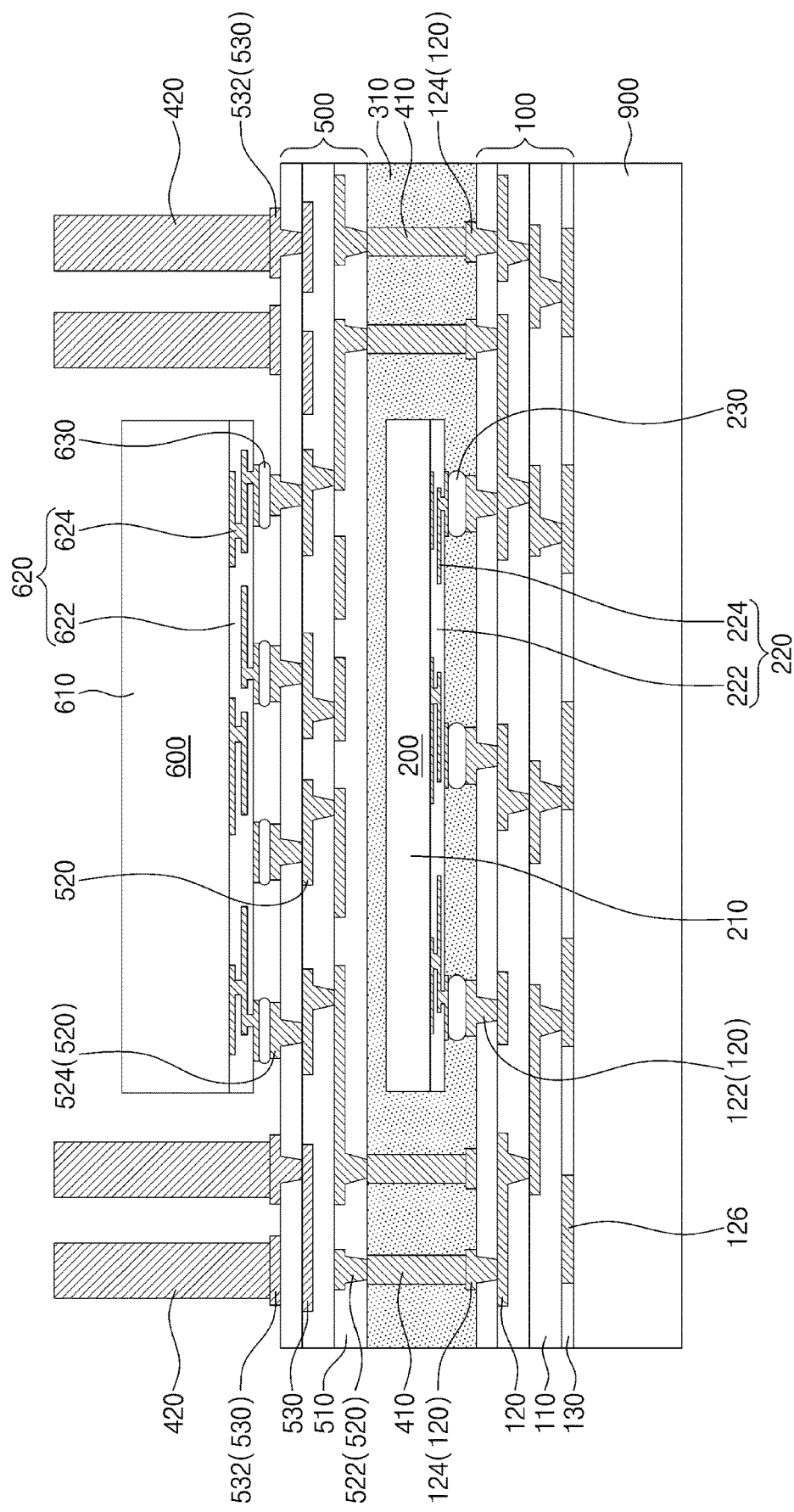

Referring to FIG. 20, a second semiconductor chip 600 may be provided. The second semiconductor chip 600 may have a configuration the same as or similar to that discussed with reference to FIG. 1. For example, the second semiconductor chip 600 may include a second base layer 610 and a second circuit layer 620. The second circuit layer 620 is provided on an active surface of the second base layer 610.

The second semiconductor chip 600 may be mounted on the second substrate 500. For example, a second chip terminal 630 may be provided on a second chip pad 624 of the second semiconductor chip 600. The second semiconductor chip 600 may be aligned to place the second chip terminal 630 of the second substrate 500 on the fourth substrate pad 524, and then a reflow process may be performed to connect the second chip terminal 630 to the fourth substrate pad 524.

Figure 21:
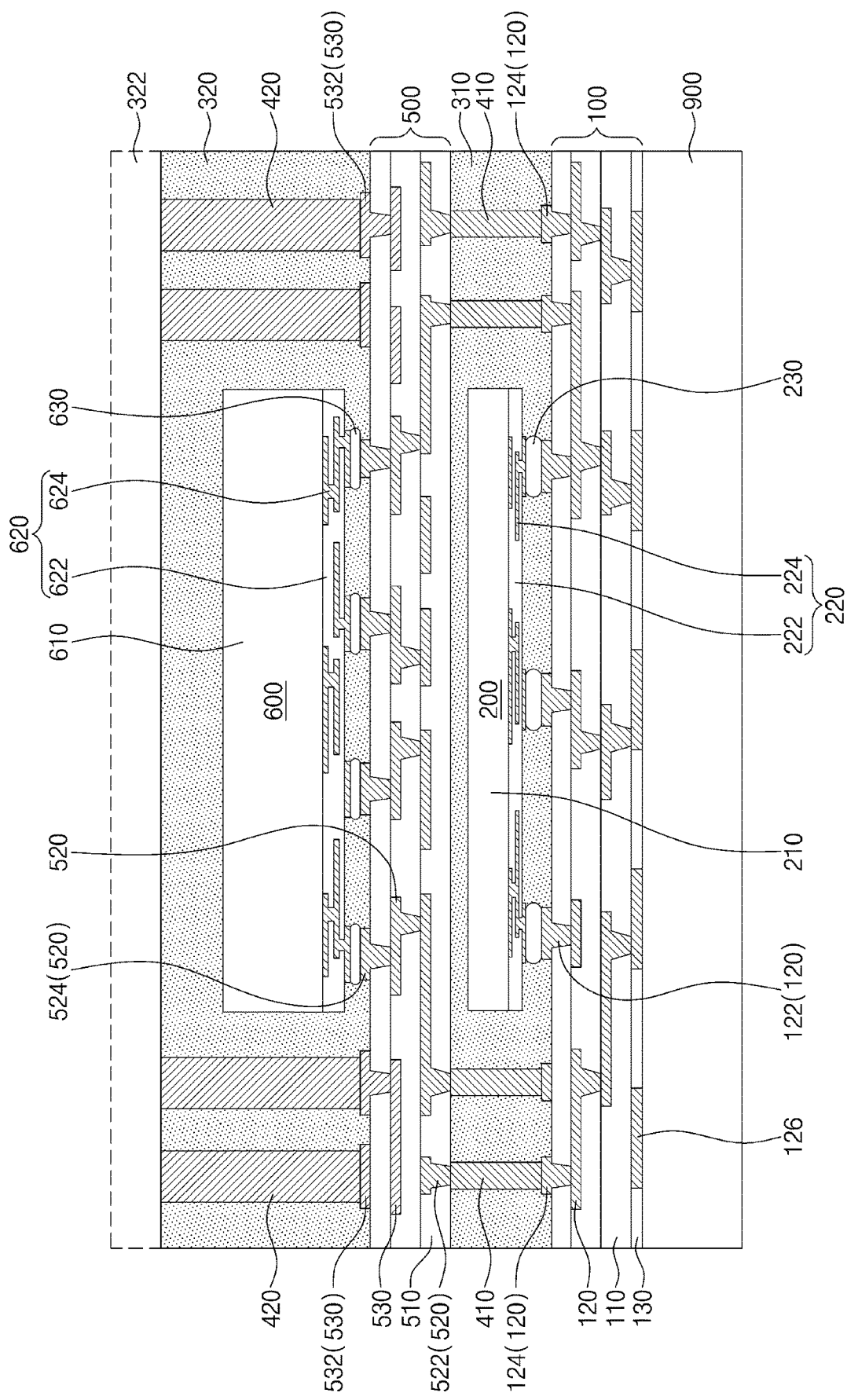

Referring to FIG. 21, a second molding layer 320 may be formed on the second substrate 500. For example, the second substrate 500 may be coated on a top surface with a dielectric molding material to encapsulate the second semiconductor chip 600. The molding material may be cured to form the second molding layer 320. The second molding layer 320 may cover lateral and top surfaces of the second semiconductor chip 600. The second molding layer 320 may surround the second through via 420. The second through via 420 may be embedded in the second molding layer 320.

An upper portion 322 of the second molding layer 320 may be removed. For example, the second molding layer 320 may undergo a thinning process. For example, a grinding process or a chemical mechanical polishing (CMP) process may be performed on a top surface of the second molding layer 320. Therefore, the top surface of the second molding layer 320 may become flat. The thinning process may be executed to expose a top surface of the second through via 420. The thinning process may remove the upper portion 322 of the second molding layer 320, and as needed may also remove an upper portion of the second through via 420. After the thinning process, the top surface of the second through via 420 may be exposed. The second through via 420 and the second molding layer 320 may have top surfaces that form substantially flat coplanar surfaces. As such, it may be possible to fabricate a semiconductor package discussed with reference to FIG. 1. According to some embodiments, the thinning process may be performed to expose the second through via 420 and the second semiconductor chip 600 so that a heat radiator may be provided on the exposed top surface of the second through via 420 and the exposed top surface of the second semiconductor chip 600 to fabricate a semiconductor package as discussed with reference to FIG. 7.

FIGS. 22 to 25 illustrate cross-sectional views showing a method of fabricating a semiconductor package according to some embodiments of the present inventive concepts.

Figure 22:
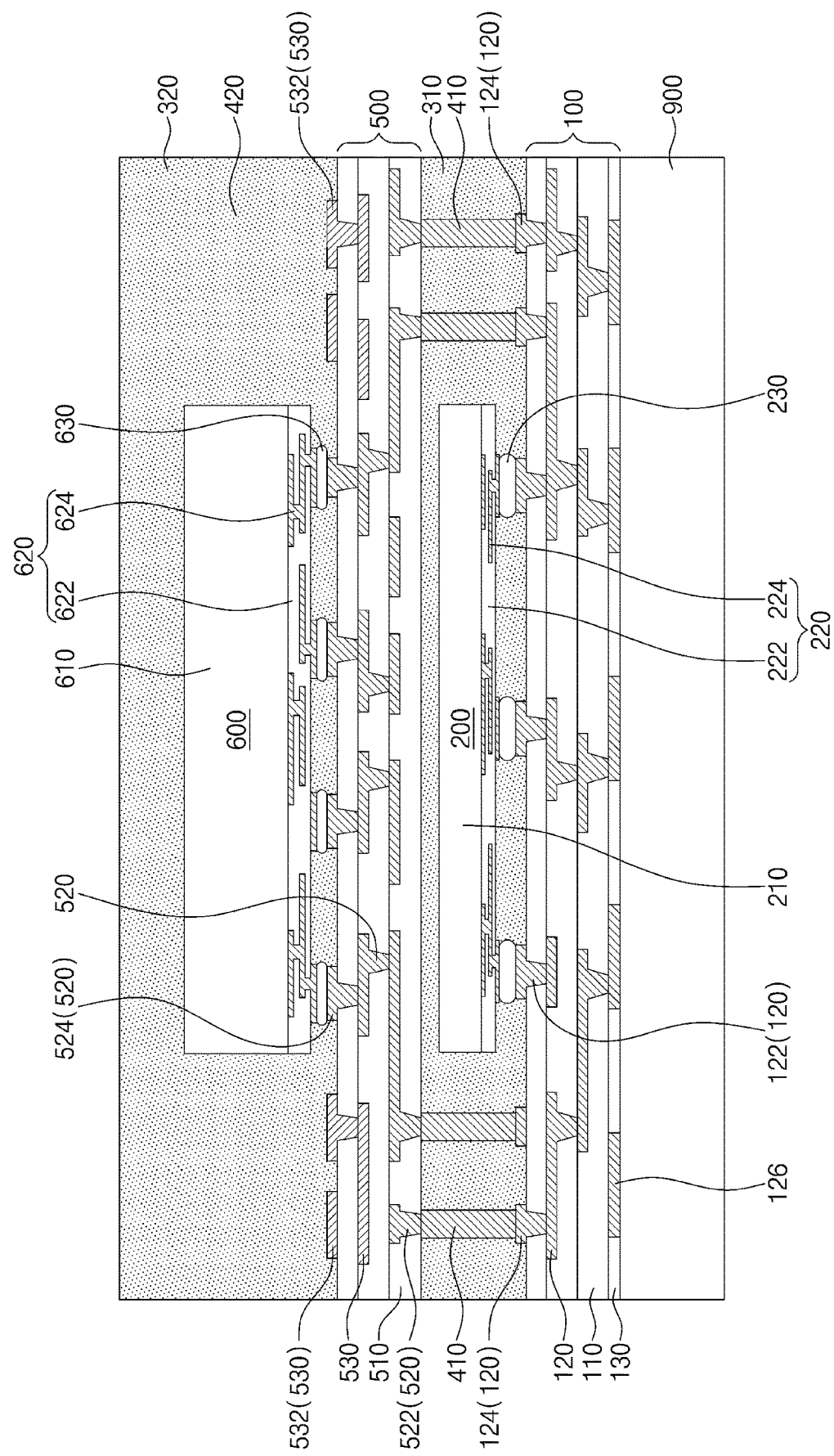

Referring to FIG. 22, a second semiconductor chip 600 may be provided on a resultant structure of FIG. 18. For example, the second semiconductor chip 600 may include a second base layer 610 and a second circuit layer 620. The second circuit layer 620 may be disposed on an active surface of the second base layer 610.

The second semiconductor chip 600 may be mounted on the second substrate 500. For example, a second chip terminal 630 may be provided on a second chip pad 624 of the second semiconductor chip 600, and after the second semiconductor chip 600 is aligned to the second substrate 500 such that the second chip terminal 630 is disposed on the fourth substrate pad 524 of the second substrate 500, a reflow process may be performed to connect the second chip terminal 630 to the fourth substrate pad 524.

A second molding layer 320 may be formed on the second substrate 500. For example, the second substrate 500 may be coated on a top surface with a dielectric molding material to encapsulate the second semiconductor chip 600, and the molding material may be cured to form the second molding layer 320. The second molding layer 320 may cover lateral and top surfaces of the second semiconductor chip 600.

Figure 23:
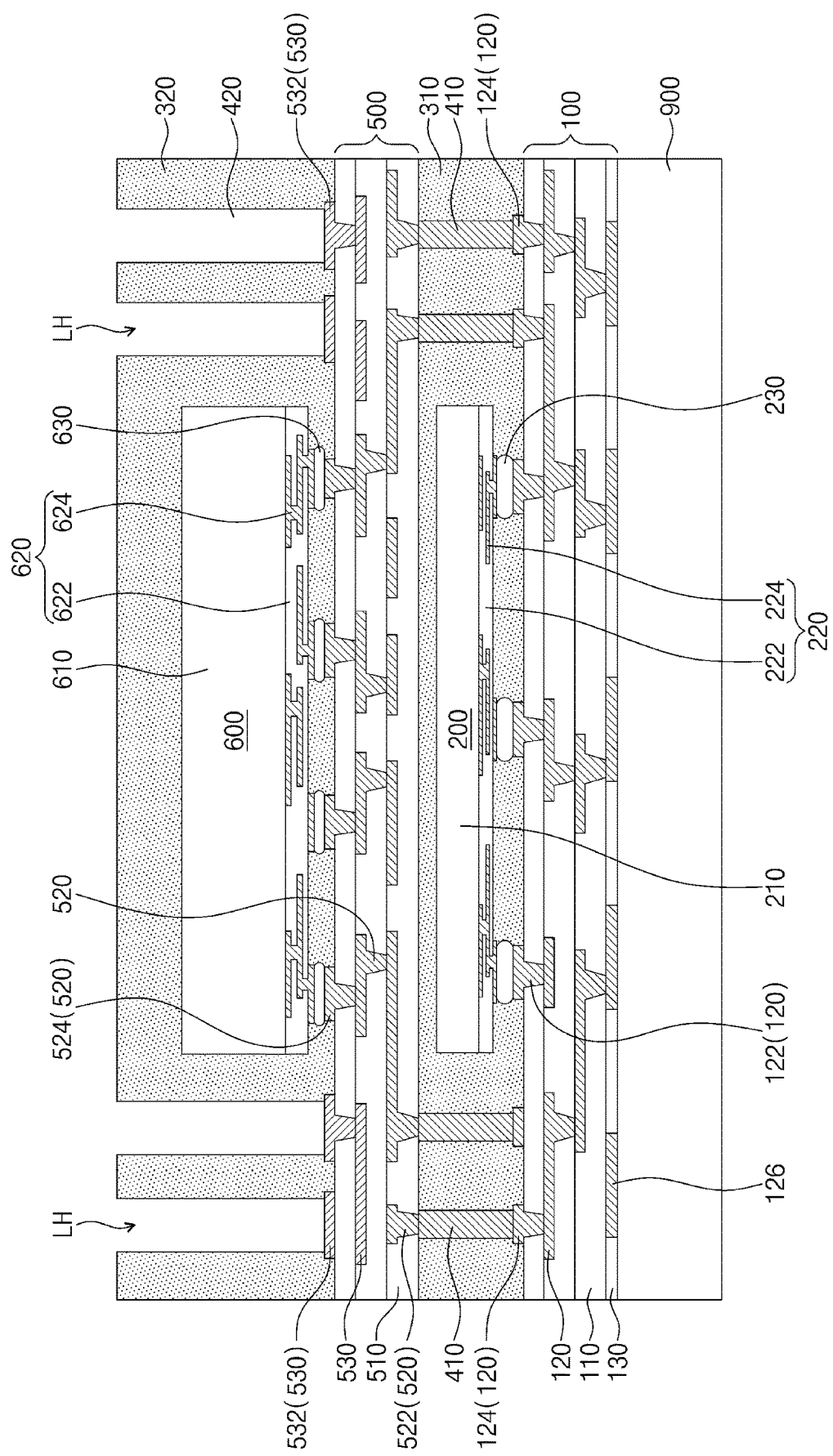

Referring to FIG. 23, a via hole VH may be formed in the second molding layer 320. The via hole VH may vertically penetrate the second molding layer 320 to expose the fifth substrate pad 532 of the second substrate 500. The via hole VH may have a width greater than that of the first through via 410.

Figure 24:
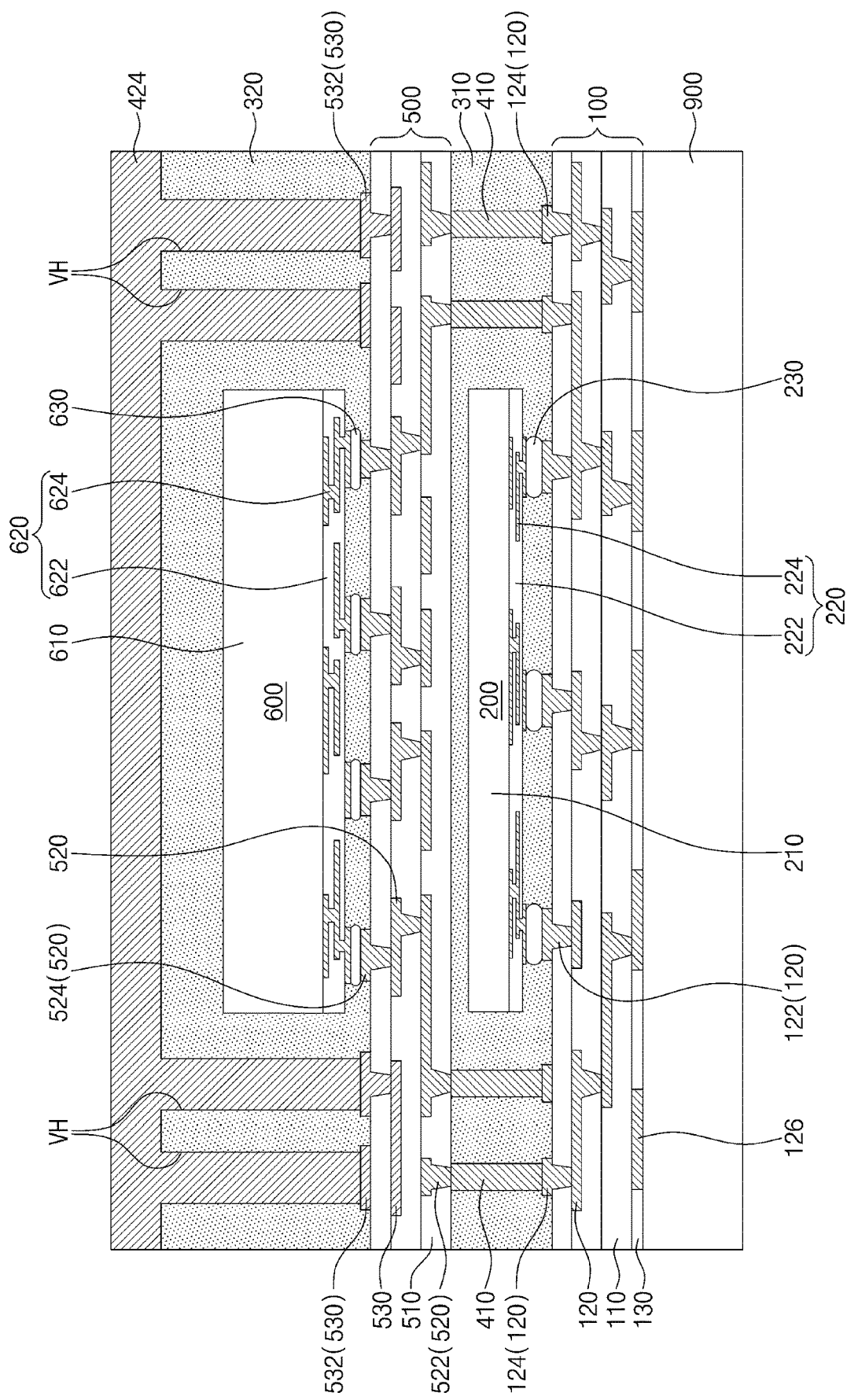

Referring to FIG. 24, a conductive layer 424 may be formed on the second molding layer 320. For example, a seed layer may be conformally formed in the via hole VH. Afterwards, the second molding layer 320 may undergo a plating process in which the seed layer is used as a seed. For example, the plating process may be an electroplating process. In the plating process, the via hole VH may be filled with a conductive material to from the conductive layer 424.

The seed layer may cover the top surface of the second molding layer 320, and in the plating process, the conductive material may also be deposited on the top surface of the second molding layer 320. For example, the conductive layer 424 may fill the via hole VH and cover the second molding layer 320.

Figure 25:
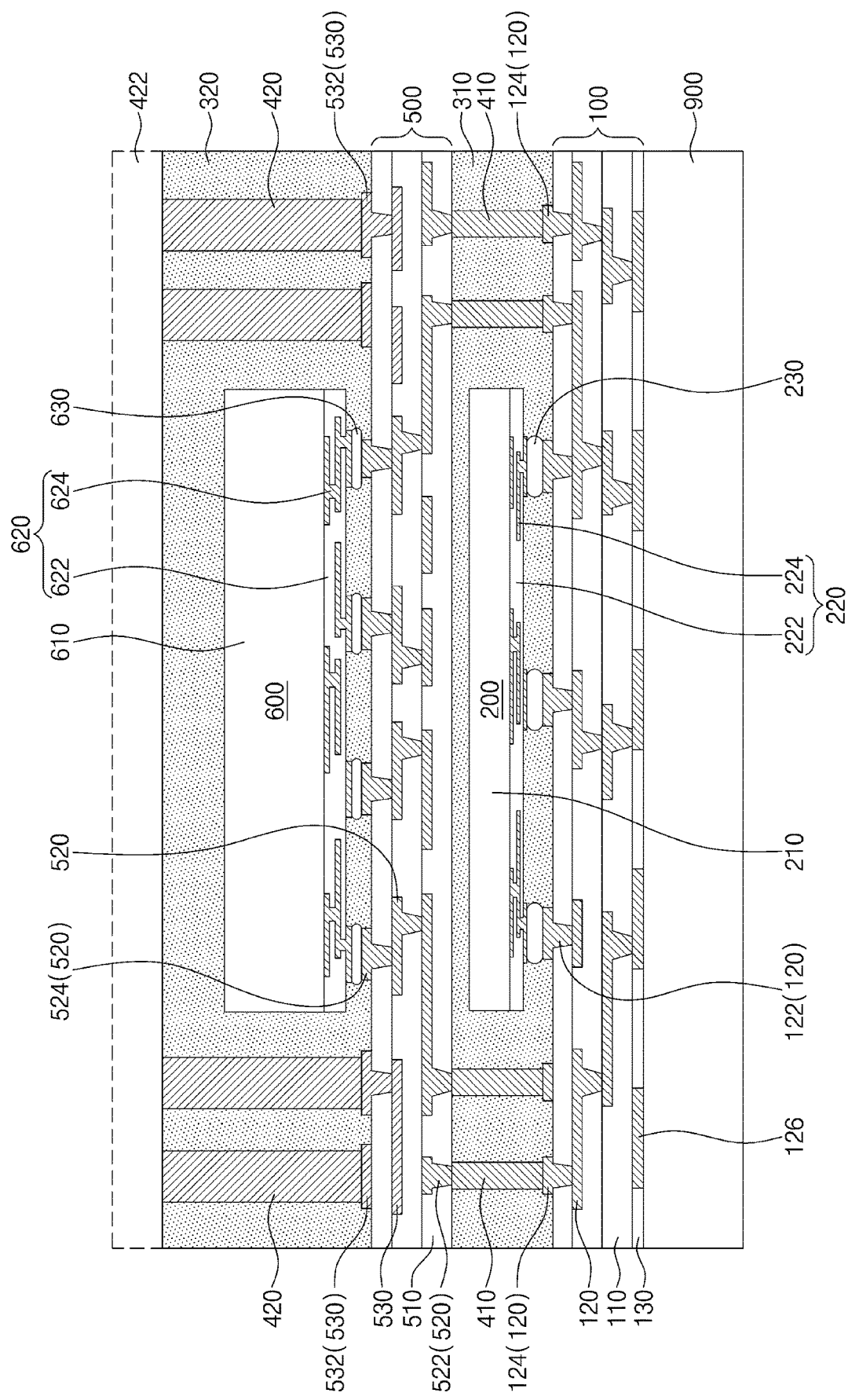

Referring to FIG. 25, a portion 422 of the conductive layer 424 may be removed. For example, the conductive layer 424 may undergo a thinning process. For example, a grinding process or a chemical mechanical polishing (CMP) process may be performed on a top surface of the conductive layer 424. Therefore, the top surface of the conductive layer 424 may become flat. The thinning process may be executed to expose the top surface of the second molding layer 320. The thinning process may also remove the seed layer positioned on the top surface of the second molding layer 320. After the thinning process, the conductive layer 424 may have a portion that remains in the via hole VH, and the remaining portion of the conductive layer 424 may constitute a second through via 420. The second through via 420 and the second molding layer 320 may have top surfaces that form substantially flat coplanar surfaces. As such, it may be possible to fabricate a semiconductor package discussed with reference to FIG. 1.

According to some embodiments, the thinning process may not remove the portion 422 of the conductive layer 424. The portion 422 is positioned on the top surface of the second molding layer 320. The portion 422 of the conductive layer 424 may constitute an extension 422 as discussed with reference to FIG. 8. The semiconductor package of FIG. 8 may be fabricated using a method of fabricating the semiconductor package as discussed with reference to FIG. 5.

In a semiconductor package according to some embodiments of the present inventive concepts, a first substrate may be connected to a second substrate using a first through via only. Therefore, an electrical connection length may be reduced between the first substrate and a second semiconductor chip, and the semiconductor package may improve in electrical properties.

Heat concentrated on the second substrate and heat generated from first and second semiconductor chips may be easily outwardly discharged through a second through via. Therefore, the semiconductor package may decrease in temperature, improve in thermal stability, and increase in operating reliability.

The second through via may partially shield electromagnetic waves that are transferred outwardly. Accordingly, the semiconductor package may improve in operating stability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a package substrate;
a first semiconductor chip mounted on the package substrate;
a first molding layer on the package substrate and surrounding the first semiconductor chip;
a redistribution layer on the first molding layer;
a first through via that vertically penetrates the first molding layer and connects the package substrate to the redistribution layer;
a second semiconductor chip mounted on the redistribution layer;
a second molding layer on the redistribution layer and surrounding the second semiconductor chip; and
a second through via that vertically penetrates the second molding layer and is connected to the redistribution layer,
wherein a first width of the first through via is less than a second width of the second through via,
wherein the second through via is electrically floated from the first through via and a signal circuit of the second semiconductor chip, and
wherein the second through via vertically overlaps the first through via.

2. The semiconductor package of claim 1,
wherein the redistribution layer includes:
a dielectric pattern;
a redistribution pattern in the dielectric pattern and connecting the second semiconductor chip to the first through via; and a dummy wiring pattern in the dielectric pattern and connected to the second through via, the dummy wiring pattern being electrically floated from the redistribution pattern.

3. The semiconductor package of claim 2, wherein the first through via is directly connected to the redistribution pattern of the redistribution layer.

4. The semiconductor package of claim 2, wherein when viewed in a plan view, the dummy wiring pattern extends from a region below the second semiconductor chip beyond a first side of the second semiconductor chip, and
wherein the dummy wiring pattern is connected to the second through via that is adjacent to the first side of the second semiconductor chip.

5. The semiconductor package of claim 1, wherein the redistribution layer includes a signal pad and a dummy pad that are at a top surface of the redistribution layer,
wherein the second semiconductor chip is connected to the signal pad through a chip terminal which is on a bottom surface of the second semiconductor chip, and
wherein the second through via is connected to the dummy pad.

6. The semiconductor package of claim 1, wherein the second through via is provided in plural, and wherein when viewed in a plan view, the plurality of second through vias surround the second semiconductor chip.

7. The semiconductor package of claim 1, wherein the second through via has a bar shape that extends in a first direction on the redistribution layer.

8. The semiconductor package of claim 1, wherein the second through via has a rectangular loop shape, and
wherein when viewed in a plan view, the rectangular loop shape of the second through via surrounds the second semiconductor chip.

9. The semiconductor package of claim 1, wherein a top surface of the second through via is exposed at a top surface of the second molding layer, and
wherein no electrical connection element is connected to the top surface of the second through via.

10. The semiconductor package of claim 1, further comprising:
a heat radiator on a top surface of the second molding layer,
wherein the second through via is connected to the heat radiator.

11. The semiconductor package of claim 1, wherein the package substrate includes a first substrate pad and a second substrate pad that are on a top surface of the package substrate,
wherein the first semiconductor chip is connected to the first substrate pad through a chip terminal which is on a bottom surface of the first semiconductor chip, and
wherein the first through via is connected to the second substrate pad.

12. A semiconductor package, comprising:
a first substrate;
a first semiconductor chip mounted on a first region of the first substrate;
a second substrate on the first semiconductor chip;
a first through via disposed on a second region, adjacent to the first region, of the first substrate and directly connecting the first substrate to the second substrate;
a second semiconductor chip mounted on a third region of the second substrate;
a heat radiator on the second semiconductor chip;
a second through via on a fourth region, adjacent to the third region, of the second substrate and directly connecting the second substrate to the heat radiator; and
a plurality of external terminals on a bottom surface of the first substrate,
wherein the second through via is electrically insulated from the second semiconductor chip, and
wherein the second through via overlaps the first through via.

13. The semiconductor package of claim 12, wherein a width of the second through via is greater than a width of the first through via.

14. The semiconductor package of claim 12, wherein the second substrate includes:
a dielectric pattern;
a redistribution pattern in the dielectric pattern and connecting the second semiconductor chip to the first through via; and
a dummy wiring pattern in the dielectric pattern and connected to the second through via, the dummy wiring pattern being electrically floated from the redistribution pattern.

15. The semiconductor package of claim 14, wherein the first through via is directly connected to the redistribution pattern of the second substrate.

16. The semiconductor package of claim 14, wherein when viewed in a plan view, the dummy wiring pattern extends from a region below the second semiconductor chip beyond a first side of the second semiconductor chip, and
wherein the dummy wiring pattern is connected to the second through via that is adjacent to the first side of the second semiconductor chip.

17. The semiconductor package of claim 12, wherein when viewed in a plan view,
the second through via and the first through via do not overlap each other so that the second through via is spaced apart from the first through via.

18. The semiconductor package of claim 12, wherein the heat radiator contacts a top surface of the second semiconductor chip.

19. A semiconductor package, comprising:
a package substrate;
a first semiconductor chip disposed on a first region of the package substrate and mounted on a first substrate pad of the package substrate through a first chip terminal;
a first molding layer on the package substrate and surrounding the first semiconductor chip;
a first through via disposed on a second region, adjacent to the first region, of the package substrate and vertically penetrating the first molding layer, the first through via being connected to a second substrate pad of the package substrate;
a redistribution layer on the first molding layer and connected to the first through via which is exposed at an upper surface of the first molding layer;
a second semiconductor chip disposed on a third region of the redistribution layer and mounted on a signal pad of the redistribution layer through a second chip terminal;
a second molding layer on the redistribution layer and surrounding the second semiconductor chip;
a second through via disposed on a fourth region, adjacent to the third region, of the redistribution layer and vertically penetrating the second molding layer, the second through via being connected to a dummy pad of the redistribution layer; and a plurality of external terminals on a bottom surface of the package substrate, wherein the second through via is electrically insulated from the second semiconductor chip and the first through via, and wherein the second through via vertically overlaps the first through via.

* * * * *